United States Patent
Stradins et al.

(10) Patent No.: US 11,961,925 B2
(45) Date of Patent: Apr. 16, 2024

(54) ENGINEERED NANOSTRUCTURED PASSIVATED CONTACTS AND METHOD OF MAKING THE SAME

(71) Applicant: Alliance for Sustainable Energy, LLC, Golden, CO (US)

(72) Inventors: Pauls Stradins, Golden, CO (US); William Michael Nemeth, Wheat Ridge, CO (US); David Levi Young, Golden, CO (US); Caroline Lima Salles de Souza, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 151 days.

(21) Appl. No.: 17/516,533

(22) Filed: Nov. 1, 2021

(65) Prior Publication Data

US 2022/0140161 A1    May 5, 2022

Related U.S. Application Data

(60) Provisional application No. 63/107,628, filed on Oct. 30, 2020.

(51) Int. Cl.
*H01L 31/0224* (2006.01)
*H01L 29/45* (2006.01)
*H01L 31/18* (2006.01)

(52) U.S. Cl.
CPC .... *H01L 31/022441* (2013.01); *H01L 29/456* (2013.01); *H01L 31/1868* (2013.01)

(58) Field of Classification Search
CPC ............ H01L 29/456; H01L 31/02167; H01L 31/0224–022491; H01L 31/061; H01L 31/0745; H01L 31/1804; H01L 31/1868
See application file for complete search history.

(56) References Cited

U.S. PATENT DOCUMENTS

2009/0017617 A1* 1/2009 Rohatgi .......... H01L 31/022425
257/E21.575
2019/0273149 A1    9/2019 Huang et al.

FOREIGN PATENT DOCUMENTS

WO    WO-2006097303 A1 *    9/2006    ....... H01L 31/02167

OTHER PUBLICATIONS

Allen, T.G. et al., "Passivating contacts for crystalline silicon solar cells," Nature Energy, vol. 4, 2019, 15 pages.

(Continued)

*Primary Examiner* — Andres Munoz
(74) *Attorney, Agent, or Firm* — Michael A. McIntyre

(57) ABSTRACT

The present disclosure relates to a passivating contact that includes a dielectric layer constructed of a first material, an intervening layer constructed of a second material, and a substrate constructed of a semiconductor, where the dielectric layer is positioned between the substrate and the intervening layer, the dielectric layer has a first thickness, and the substrate has a second thickness. The passivating contact also includes a plurality of conductive pathways that include the second material and pass through the first thickness, the second material penetrates into the second thickness forming a plurality of penetrating regions within the substrate, and the plurality of conductive pathways are configured to allow current to pass through the first thickness.

8 Claims, 13 Drawing Sheets

(56) References Cited

OTHER PUBLICATIONS

Chartier, C. et al., "Metal-assisted chemical etching of silicon in HF-H2O2," Elsevier Electrochimica Acta, vol. 53, 2008, 8 pages.
David, M. et al., "First-principles calculations-based model for the reactive ion etching of metal oxide surfaces," Elsevier Vacuum, vol. 83, 2009, 3 pages.
Folchert, N. et al., "Temperature-dependent contact resistance of carrier selective Poly-Si on oxide junctions," Elsevier Solar Energy Materials and Solar Cells, vol. 185, 2018, 6 pages.
Folchert, N. et al., "Modeling recombination and contact resistance of poly-Si junctions," Wiley Progress in Photovoltaics, vol. 28, 2020, 19 pages.
Haase, F. et al., "Laser contact openings for local poly-Si-metal contacts enabling 26.1%-efficient POLO-IBC solar cells," Elsevier Solar Energy Materials and Solar Cells, vol. 186, 2018, 10 pages.
Ho, W-J et al., "Electrical and optical properties of thin film silicon solar cells with sub-wavelength surface structure and TiO2 passivation," Elsevier Vacuum, vol. 118, 2015, 5 pages.
Hollemann, C. et al., "Separating the two polarities of the POLO contacts of an 26.1%-efficient IBC solar cell," Scientific Reports, 10:658, 2020, 15 pages.
Huang, Z. et al., "Metal-Assisted Chemical Etching of Silicon: A Review," Advanced Materials, Materials Views, vol. 23, 2011, 25 pages.
Jooss, W. et al., "Process development for MCCE textured solar cells on multicrystalline DWS wafer," IEEE 7th World conference on Photovoltaic Energy Conversion, A Joint Conference of 45th IEEE PVSC, 28th PVSEC & 34th EU PVSEC, 2018, 5 pages.
Kale, A. et al., "Effect of silicon oxide thickness of polysilicon based passivated contacts for high-efficiency crystalline silicon solar cells," Elsevier Solar Energy Materials and Solar Cells, vol. 185, 2018, 7 pages.
Lee, C-L et al., "Pore formation in silicon by wet etching using micrometre-sized metal particles as catalysts," Journal of Materials Chemistry, vol. 18, 2008, 6 pages.
Peibst, R. et al., "Working principle of carrier selective poly-Si/c-Si junctions: Is tunneling the whole story?," Elsevier Solar Energy Materials & Solar Cells, vol. 158, 2016, 8 pages.
Polzin, J-I et al., "Temperature-induced stoichiometric changes in thermally grown interfacial oxide in tunnel-oxide passivating contacts," Elsevier Solar Energy Materials and Solar Cells, vol. 218, 2020, 8 pages.
Richter, A. et al., "N-Type Si solar cells with passivating electron contact: Identifying sources for efficiency limitations by wafer thickness and resistivity variation," Elsevier Solar Energy Materials and Solar Cells, vol. 173, 2017, 10 pages.
Richter, A. et al., "Both Sides Contacted Silicon Solar Cells: Options for Approaching 26% Efficiency," Conference Paper, 36th European Photovoltaic Solar Energy Conference and Exhibition, Marseille, France, 2019, 6 pages.
Tetzlaff, D. et al., "A simple method for pinhole detection in carrier selective POLO-junctions for high efficiency silicon solar cells," Elsevier Solar Energy Materials and Solar Cells, vol. 173, 2017, 5 pages.
Tsujino, K. et al., "Morphology of nanoholes formed in silicon by wet etching in solutions containing HF and H2O2 at different concentrations using silver nanoparticles as catalysts," Elsevier Electrochimica Acta, vol. 53, 2007, 7 pages.
Young, D.L. et al., "Gallium-Doped Poly-Si:Ga/SiO2 Passivated Emitters to n-Cz Wafers With iVoc>730 mV," IEEE Journal of Photovoltaics, vol. 7, No. 6, Nov. 2017, 6 pages.
Haase, F. et al., "Interdigitated back contact solar cells with polycrystalline silicon on oxide passivating contacts for both polarities," Japanese Journal of Applied Physics, vol. 56, 2017, 6 pages.
Hutchins, M. et al., "New cell efficiency records for Trina and Canadian Solar," https://www.pv-magazine.com/2019/05/28, May 28, 2019, 7 pages.

* cited by examiner

US 11,961,925 B2

ENGINEERED NANOSTRUCTURED PASSIVATED CONTACTS AND METHOD OF MAKING THE SAME

CROSS-REFERENCE TO RELATED APPLICATIONS

This application claims priority from U.S. Provisional Patent Application No. 63/107,628 filed on Oct. 30, 2020, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Poly-Si/SiO$_x$ passivating contacts are an emerging technology in industrial silicon solar cell manufacturing lines. These contacts combine excellent passivation and conductivity properties, enabling some of the highest lab-scale silicon solar cell efficiencies, as well as the current industrial record. These contacts are classified in terms of their predominant charge-carrier transport mechanism, either via quantum tunnelling (SiO$_x$<1.7 nm) or ohmic conduction through holes (or electrically conductive regions) in the dielectric (SiO$_x$>2.1 nm). While industry has implemented the tunnelling class, hole-enabled contacts offer important advantages: (i) thicker oxide allows for more efficient hindering of dopant diffusion into the wafer, and (ii) withstands higher thermal budgets during annealing, which can be applied to effectively reduce interface defect state density; both aspects can contribute to better passivation performance. Currently, the hole creation process relies on thermally inducing their formation via a high temperature process (temperatures greater than 1000° C.). Perhaps due to its quite high thermal budget requirement and/or perhaps due to the hole formation sensitivity to oxide thickness variations (which occur in oxidative batch processes), industrial cells have not yet incorporated the hole class of contacts. Thus, there remains a need for improved methods for producing better performing passivating contacts for the silicon solar cell industry.

SUMMARY

An aspect of the present disclosure is a passivating contact that includes a dielectric layer constructed of a first material, an intervening layer constructed of a second material, and a substrate constructed of a semiconductor, where the dielectric layer is positioned between the substrate and the intervening layer, the dielectric layer has a first thickness, and the substrate has a second thickness. The passivating contact also includes a plurality of conductive pathways that include the second material and pass through the first thickness, the second material penetrates into the second thickness forming a plurality of penetrating regions within the substrate, and the plurality of conductive pathways are configured to allow current to pass through the first thickness.

In some embodiments of the present disclosure, the semiconductor may include at least one of silicon, a III-V alloy, a perovskite, cadmium, and/or tellurium. In some embodiments of the present disclosure, the substrate may include a planarized surface. In some embodiments of the present disclosure, the substrate may include a textured surface. In some embodiments of the present disclosure, the second thickness may be between about 0.1 μm and about 1000 μm. In some embodiments of the present disclosure, the substrate includes silicon. In some embodiments of the present disclosure, at least a portion of the penetrating regions penetrate between about 1 nm and about 1000 nm into the second thickness. In some embodiments of the present disclosure, the first material has a band gap greater than about 2 eV. In some embodiments of the present disclosure, the band gap is between about 2 eV and about 20 eV.

In some embodiments of the present disclosure, the first material is configured to passivate the substrate. In some embodiments of the present disclosure, the first material may include at least one of an oxide, a nitride, an amorphous silicon, and/or a carbide. In some embodiments of the present disclosure, the first material may include at least one of a silicon oxide, an aluminum oxide, a titanium oxide, a silicon nitride, a silicon carbide, a silicon oxynitride, an indium oxide, and/or a tin oxide. In some embodiments of the present disclosure, the first material may include at least one of a silicon oxide and/or a silicon nitride. In some embodiments of the present disclosure, the first thickness may be between about 1.9 nm and about 50.0 nm. In some embodiments of the present disclosure, the dielectric layer may include a first layer and a second layer, where the second layer is positioned between the first layer and the substrate. In some embodiments of the present disclosure, the first layer includes a silicon nitride and the second layer includes a silicon oxide.

In some embodiments of the present disclosure, the second material includes at least one of a metal, post-transition metal, a metalloid, and/or a non-metal. In some embodiments of the present disclosure, second material includes silicon.

An aspect of the present disclosure is a device that includes a substrate constructed of a semiconductor and a passivating contact that includes a dielectric layer constructed of a first material, an intervening layer constructed of a second material, and a portion of the substrate. Further, the dielectric layer is positioned between the substrate and the intervening layer, the dielectric layer has a first thickness, and the substrate has a second thickness. Further, a plurality of conductive pathways that include the second material pass through the first thickness, the second material penetrates into the second thickness forming a plurality of penetrating regions within the substrate, and the plurality of conductive pathways are configured to allow current to pass through the first thickness.

An aspect of the present disclosure is a method for making a passivating contact, where the method includes a first treating of a first intermediate device that includes a substrate and a dielectric layer having a thickness, where the first treating results in the forming of a second intermediate device having at least one of a hole or a crack that passes through the thickness or a region of dielectric breakdown through the thickness; depositing a temporary layer onto the second intermediate device to form a third intermediate device, such that the dielectric layer is positioned between the substrate and the temporary layer; and a second treating of the second intermediate device resulting in the forming of a device that includes the passivating contact. Further, the second treating converts at least a portion of the temporary layer to an intervening layer where the dielectric layer is positioned between the substrate and the intervening layer, and the second treating drives at least a portion a material making up the intervening layer through the dielectric layer via at least one of the hole, or the crack, or the region of dielectric breakdown, thereby forming a conductive pathway through the dielectric layer.

BRIEF DESCRIPTION OF DRAWINGS

Some embodiments are illustrated in referenced figures of the drawings. It is intended that the embodiments and figures disclosed herein are to be considered illustrative rather than limiting.

Figure 1:
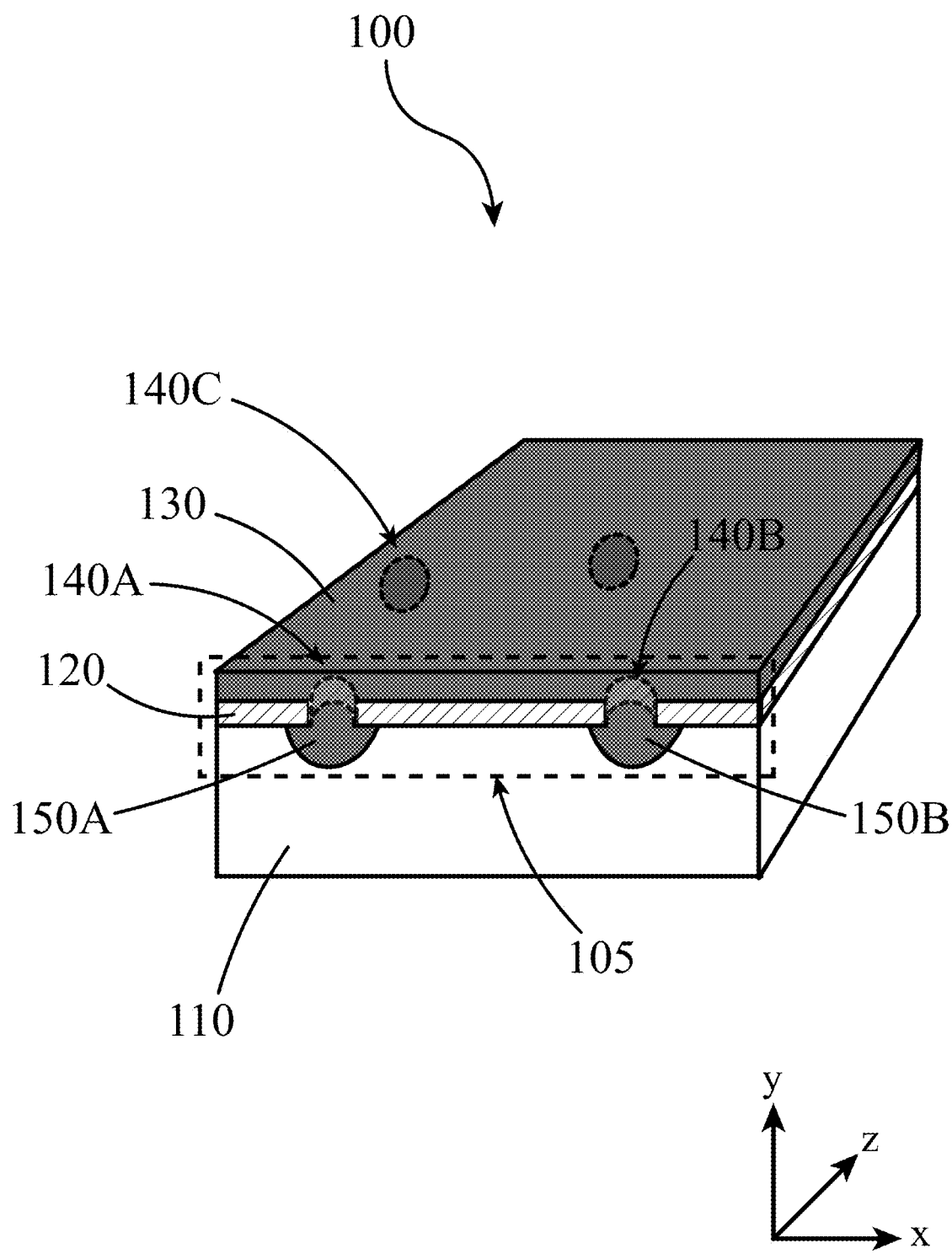
FIG. 1 illustrates a device, according to some embodiments of the present disclosure.

| REFERENCE NUMERALS | |
|---|---|
| 100 | device |
| 105 | passivated contact |
| 110 | silicon substrate |
| 120 | dielectric layer |
| 130 | intervening layer (e.g., doped silicon) |
| 140 | hole |
| 150 | penetrating region (of doped silicon) |
| 200 | method |
| 203 | depositing nanoparticles |
| 205 | nanoparticles |
| 207 | first temporary layer (e.g. intrinsic silicon) |
| 210 | creating holes |
| 220 | perfecting holes |
| 230 | depositing layer |
| 235 | second temporary layer (e.g., heavily doped a-Si) |
| 240 | treating (e.g., annealing) |
| 250 | intermediate device |
| 300 | stamp |
| 310 | nanoparticle solution |
| 320 | dipping (of stamp into solution) |
| 330 | applying (stamp and particles to surface) |
| 400 | high voltage source |
| 410 | electric arc |
| 420 | conductive pathways |
| 430 | back contact |
| 440 | additional dielectric layer |

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Among other things, the present disclosure relates to methods for manufacturing nanostructured (nano-hole based) passivating contacts on the photovoltaic absorber materials of solar cells. As described herein, instead of relying on random hole formation on the surfaces of the absorber materials at high temperatures, with narrow process windows and strong sensitivities to layer pre-treatments, dopant concentrations, etc., the methods described herein provide ways to pre-engineer and/or pre-select the location of these nano-holes in a passivating layer. Thus, the methods described herein may enable a specific hole density (number of holes per unit area) to be achieved, in some embodiments, in a specific pattern, and having specified average hole diameters. It is envisioned that these methods, and the improved passivating contacts resulting therefrom, will enable the inexpensive mass production of solar cells based on these passivating contacts. As shown herein, these methods may result in, among other things, the formation of passivating contacts having dielectric layers (e.g., $SiO_x$ and/or $SiN_y$) having thicknesses greater than about 2.0 nm with a plurality of holes as the primary charge-carrier transport mechanism as quantified by correlating contact electrical resistance measurements to the experimentally determined hole areal densities obtained from electron and optical microscopy.

FIG. 1 illustrates an exemplary device 100, for example the rear side of a silicon solar cell, that includes a passivating contact 105, according to some embodiments of the present disclosure. This exemplary passivating contact 105 is highlighted in FIG. 1 by the dashed box. This illustrates that, as defined herein, a passivating contact 105 includes a number of elements combined together and having specific relationships to one another. First, a passivating contact 105 includes a stack of at least three layers of material. Referring again to FIG. 1, these include at least a portion of a silicon substrate 110, a dielectric layer 120, and an intervening layer 130, where the dielectric layer 120 is positioned between the silicon substrate layer 110 and the intervening layer 130. In many of the examples described herein, an intervening layer is constructed of a doped silicon (e.g., polycrystalline silicon). However, the methods and devices described herein are not intended to be limited to just silicon and other semiconducting materials and/or metals may also be used to manufacture an intervening layer 130. The term "intervening" is used herein to indicated that, in some embodiments of the present disclosure, layer 130 is positioned between a silicon substrate 110 and an overlying metallic layer to prevent direct contact between these two layers, which can be detrimental to final device performance.

Referring again to FIG. 1, as a result of the method of manufacture (see FIG. 2), which is described in detail below, a passivating contact 105 as described herein, may also include a plurality of holes 140 (only three holes 140A, 140B, and 140C are specifically called out in FIG. 1) where at least a portion of the holes 140 pass completely through the thickness (in the y-direction) of the dielectric layer 120. The holes 140 enable, as a result of the manufacturing method described below, at least a portion of the material making up the intervening layer 130 (e.g., doped silicon and/or some other semiconductor and/or a metal) to pass through the dielectric layer 120 and contact and/or penetrate a portion of the underlying silicon substrate 110. These areas, volumes, and/or regions of the silicon substrate 110 containing material from the overlying doped silicon layer 130 are referred to herein as penetrating regions 150 (two penetrating regions 150A and 150B are called out in FIG. 1). Therefore, the holes 140 illustrated in FIG. 1 are not holes in the sense that they are open cavities filled with a gas (e.g., atmospheric air). Instead, the holes illustrated in FIG. 1 were, for a period of time during the manufacturing method, open cavities, but these cavities are subsequently filled with a solid and converted to intervening layer 130, with the material making up the intervening layer 130 (e.g., doped silicon) filling the holes 140 and with dopants contained in the material making up the intervening layer 130 penetrating into the underlying silicon substrate 110 as penetrating regions 150, resulting in the exemplary passivating contact 105 and device 100 shown in FIG. 1. Therefore, the exemplary device 100 shown in FIG. 1, like the passivating contact 105, also includes a stack of at least three layers, a dielectric layer 120 positioned between an intervening layer 130 and a silicon substrate 110 (e.g., a silicon wafer). Further, as described in more detail below, in some embodiments of the present disclosure, electrically conducting pathways that are not "holes" may be formed to achieve essentially the same device as illustrated in FIG. 1.

In some embodiments of the present disclosure, depending on the method of manufacturing, holes 140 may pass completely through the thickness of the dielectric layer 120. Alternatively, in some embodiments of the present disclosure, only a portion of the holes 140 pass completely through the thickness of the dielectric layer. In some embodiments of the present disclosure, a dielectric layer 120 may be constructed of a material having the characteristics of an insulating material, a conducting material, and/or a dielectric material. A dielectric layer 120 may have a band gap that is greater than about 2 eV, or a band gap that is between about 2 eV and about 20 eV. Examples of materials that may be used to construct a dielectric layer 120 include at least one of an oxide, a nitride, and/or a carbide. More specific examples of materials that may be used to construct a dielectric layer 120 include at least one of a silicon oxide, an aluminum oxide, a titanium oxide, a silicon nitride, a silicon carbide, a silicon oxynitride, an indium oxide, and/or a tin oxide. In some embodiments of the present disclosure, the thickness of a dielectric layer 120 may be between about 1.9 nm and about 200 nm, or between about 1.9 nm and about 50 nm, or between about 2.1 nm and about 10 nm. In some embodiments of the present disclosure, a dielectric layer 120 may include two or more layers (i.e., a composite dielectric layer, not shown in FIG. 1), where each layer is constructed of the same or different materials. For example, a first layer of a composite dielectric layer 120 may be constructed of a layer of $SiO_x$ and a second layer of silicon nitride ($SiN_y$) and/or aluminum oxide, where the layer of $SiN_y$ is positioned between the layer of $SiO_x$ and the doped poly-silicon layer 130. In some embodiments of the present disclosure, for example when a dielectric layer 120 includes silicon nitride and/or aluminum oxide, the thickness of the dielectric layer 120 and/or combined composite dielectric layer may be between 1.0 nm and about 200 nm.

As described above, a dielectric layer 120 may be positioned between a silicon substrate 110 and an intervening layer 130 (e.g., doped silicon). In some embodiments of the present disclosure, an intervening layer 130 may be constructed of a material that includes at least one of a post-transition metal and/or a metalloid. For the case of a silicon intervening layer 130 the silicon may include dopants such as at least one of aluminum, indium, gallium, phosphorous, boron, and/or antimony. Referring again to FIG. 1, the doped silicon used to construct an intervening layer 130 may penetrate and fill at least a portion of the holes 140 passing through the thickness of the dielectric layer 120 (or two or more dielectric layers). In some embodiments of the present disclosure, the material used to construct a doped silicon intervening layer 130 may include a heavily doped polycrystalline silicon and/or heavily doped amorphous silicon. In some embodiments of the present disclosure, a doped silicon intervening layer 130 may be doped to yield either a p-type silicon or an n-type silicon. Whether a doped silicon intervening layer 130 is p-type or n-type depends on, among other things, the dopant used, with exemplary p-type dopants include at least one of boron, aluminum, gallium, and/or indium and exemplary n-type dopants include at least one of antimony and/or phosphorous.

Referring again to FIG. 1, holes 140 may be randomly distributed across the surface of a dielectric layer 120 and may penetrate through the thickness of the dielectric layer 120, or the holes 140 may be applied to a dielectric layer 120 in a specific pattern and/or concentration (number of holes per cm$^2$), utilizing the methods described herein. In some embodiments of the present disclosure, holes 140 penetrating a dielectric layer (or layers) 120 may have an average diameter and/or characteristic width between about one nanometer and about one micron, or between about 2 nm and about 50 nm. In some embodiments of the present disclosure, the holes may be present on the surface and penetrate through the thickness of the dielectric layer 120 at a concentration between about 1e4 holes/cm$^2$ and about 1e8 holes/cm$^2$, or about between about 1e4 holes/cm$^2$ and about 1e6 holes/cm$^2$ (where this measurement of concentration of holes is also referred to as "areal density"). In some embodiments of the present disclosure, a hole 140 may have a cross-sectional shape that is substantially the shape of a circle, an oval, a triangle, a square, a rectangle, and/or any other desirable polygon or shape. In some embodiments of the present invention, a hole 140 may be in the form of a crack or fissure having a characteristic width between about one nanometer and about one micron, or between about 2 nm and about 200 nm.

Figure 2:
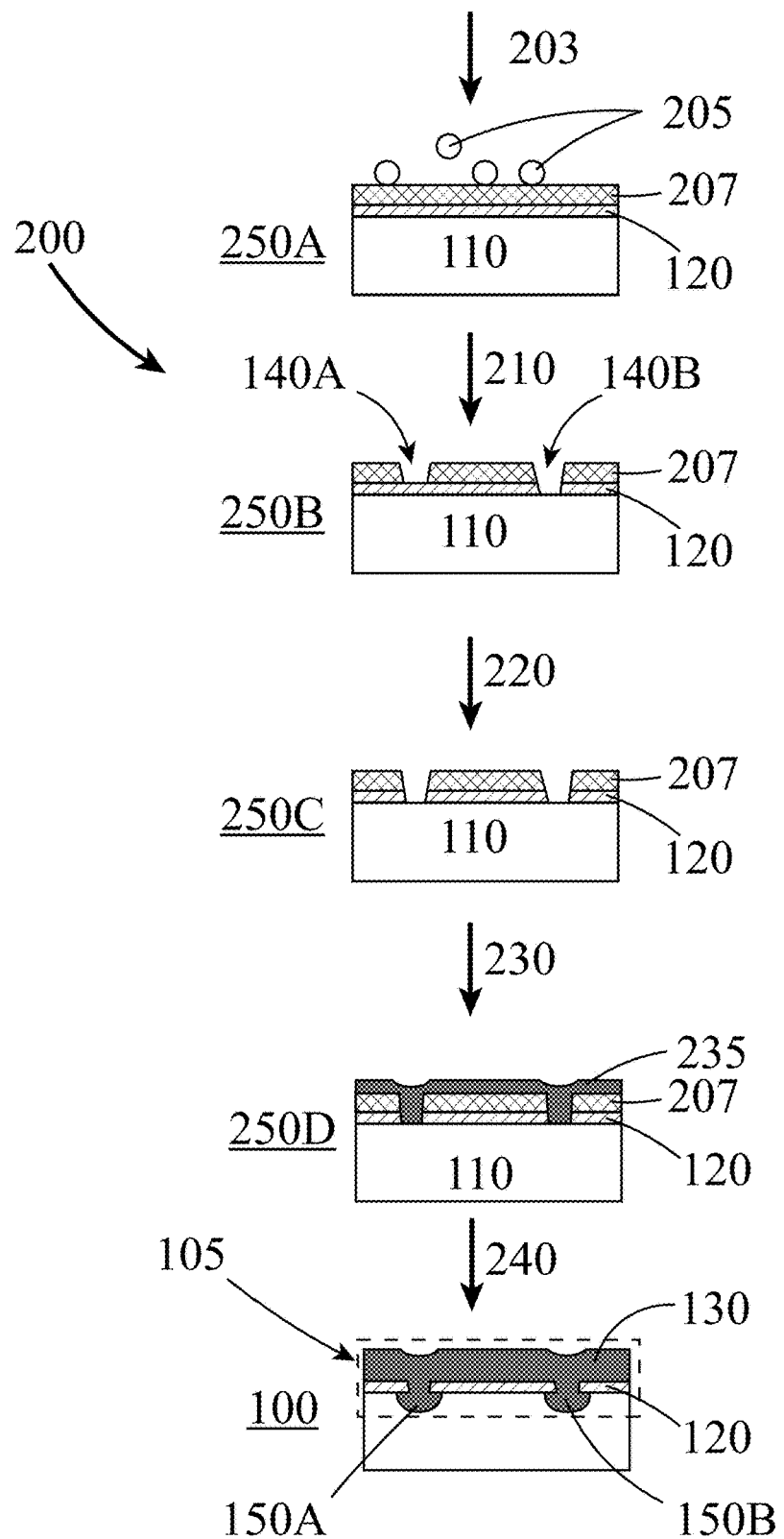
FIG. 2 illustrates a method for producing a device like that shown in FIG. 1, according to some embodiments of the present disclosure.

The final device 100 and its corresponding passivating contact 105 illustrated in FIG. 1 show holes 140 passing through the dielectric layer. FIG. 2 illustrates an exemplary method for making such a device 100. This method will be described in more detail below. However, FIG. 2 illustrates a treating 240 step, which produces the intervening layer 130 as a resulting of combining and/or transforming two temporary layers 207 and 235, in this made of an intrinsic silicon and a heavily doped silicon, respectively, with the second temporary layer 235 filing the holes 140. For a hole 140 in the form of a crack, fissure, and/or any other form, such a "hole" may have a characteristic length approximately equal to between the combined thicknesses of the dielectric layer (s) 120 and the first temporary layer 207 and about 2 to 3 times the combined thicknesses of the dielectric layer(s) 120 and the first temporary layer 207. In some embodiments of the present disclosure, the length of a crack, a fissure, and/or any other form of a hole, may be between 1 nm and 10 μm in length. In some embodiments of the present disclosure, a hole 140 may penetrate the thicknesses of the dielectric layer(s) 120 and the first temporary layer 207 at an angle that is essentially orthogonal to the plane of these layers. In some embodiments of the present disclosure, a hole 140 may penetrate the thicknesses of the dielectric layer(s) 120 and the first temporary layer 207 at an angle that is not orthogonal to the plane of these layers. In some embodiments of the present disclosure, holes 140 may be spaced apart at an average distance between about 100 nm and about 10 microns apart.

Referring again to FIG. 1, in some embodiments of the present disclosure, a device 100 and its corresponding passivating contact layer 105 may also include at least one metal layer (not shown) positioned on the intervening layer 130 (e.g., doped silicon), where the intervening layer 130 is positioned between the metal layer (not shown) and the dielectric layer 120. Thus, among other things, an intervening layer 130 may prevent the direct contact of a metal layer (not shown) with an underlying silicon substrate 110 and/or dielectric layer 120. Further, in some embodiments of the present disclosure, all of, or substantially all of the first temporary layer 207 (e.g., intrinsic silicon) shown in structure 250B may be removed after the formation of holes, followed by the deposition of aluminum onto the now exposed dielectric layer 120, thereby filling the holes 140 penetrating the dielectric layer 120 and providing a metal contact layer (these steps and the metal contact layer are not shown in FIG. 2). In some embodiments of the present disclosure, after the hole creating step 210, aluminum may be deposited onto the first temporary layer 207 (e.g., intrinsic silicon), thereby filing the holes 140 penetrating the first temporary layer 207 (which, therefore, in this embodiment, is now a permanent layer and not a temporary layer) and the dielectric layer 120. So, in some embodiments of the present disclosure, aluminum may be positioned on a first temporary layer 207 or aluminum may replace the first temporary layer 207 altogether, after hole formation through the first temporary silicon layer.

In some embodiments of the present disclosure, these examples using aluminum may be modified to utilize an aluminum-silicon alloy. For example, an alloy close to the Al—Si eutectic composition (12.6 weight % silicon, melting point 577 degrees Celsius) may provide benefits including enable more easy melting of the "doped silicon layer" and Al dopant to penetrate into the wafer through the holes. Thus, in some examples, such a eutectic composition may be applied directly to the surface of layer 207 of intermediate device 250B shown in FIG. 2. Alternatively, a first temporary layer 207, e.g., constructed of intrinsic silicon, may be removed prior to depositing an Al—Si alloy layer onto the now exposed underlying dielectric layer 120.

Examples of materials of construction for a metal layer to be deposited onto an intervening layer 130 include aluminum, silver, gold, titanium, molybdenum, copper, nickel, and combinations thereof. Therefore, in some embodiments of the present disclosure, a passivating contact 105 may include a stack of layers, in order, of a metal layer (not shown), an intervening layer 130 (e.g., doped silicon), at least one dielectric layer 120 (only one illustrated in FIG. 1), and at least a portion of an underlying silicon substrate 110. In some embodiments of the present disclosure, such a passivating contact 105 may further include one or more holes 140 penetrating the thickness or thicknesses of the one or more dielectric layers 120, where the holes are filled with the material making up the doped silicon layer 130 and where this material and/or its dopants penetrate a portion of the thickness of the silicon substrate 110, thereby forming penetrating regions 150. In some embodiments of the present disclosure, a passivating layer 105 may include at least one of cracks, fissures, and/or conducting pathways in place of or in addition to holes 140.

Referring again to FIG. 2, which illustrates an exemplary method 200 for manufacturing devices 100 and passivating contacts 105 like those illustrated in FIG. 1, according to some embodiments of the present disclosure. In this example, starting with an intermediate device 250A, the method 200 begins with the depositing 203 of nanoparticles 205 onto a surface of a first temporary layer 207 positioned on a dielectric layer 120, as described above. It should be noted that a first temporary layer 207 constructed of silicon may be doped (p-type or n-type) or may be undoped (i.e., intrinsic). In the case of a doped first temporary layer 207 of silicon, additional dopants and/or different dopants or no dopants may be subsequently applied when depositing a second temporary layer 235 as described below. The term "temporary" is used herein to indicate a layer of material that is subsequently converted into a final, "permanent" layer (e.g., an intervening layer 130 constructed of doped silicon) due to a treatment step and/or due to a combining of a temporary layer with another temporary layer. As a result of such a treating and/or combining, at least one of a chemical composition and/or physical property of a temporary layer is changed. For example, as described below, a first temporary layer 207 of intrinsic silicon may be combined with a second temporary layer 235 of doped amorphous silicon, followed by a thermal treating step, which, among other things, converts the first temporary layer 207 and the second temporary layer 235 into a final desired intervening layer 130 made of doped polycrystalline silicon, like that illustrated in FIG. 1. As described in more detail below, in some embodiment of the present disclosure, a first temporary layer 207 may be constructed using at least one of intrinsic amorphous silicon (a-silicon) and/or polycrystalline silicon (poly-silicon). Nanoparticles 205 may be deposited onto a surface of a first temporary layer 207 by a variety of methods as described in more detail below.

Once deposited, a method 200 for creating passivating contacts 105 may proceed with creating 210 holes 140, as described above, of which at least a portion may penetrate the thicknesses of both the first temporary layer 207 (e.g., intrinsic silicon) and the dielectric layer 120 (e.g., $SiO_x$). For example, such a creating 210 step may be accomplished using metal-assisted chemical etching (MACE). In this example, the creating 210 step results in the synthesis of an intermediate device 250B having holes 140 penetrating at least one of the first temporary layer 207 and the underlying dielectric layer 120. In some embodiments of the present disclosure the depositing 203 of nanoparticles 205 may be achieved using nanoparticles constructed of at least one of a transition metal (e.g., gold, silver, platinum) and/or a base metal (e.g., copper). For example, silver nanoparticles may be electrolessly plated at about room temperature onto an amorphous silicon temporary layer 207 using a very dilute silver nitrate solution ($AgNO_3:H_2O$). For example, in some embodiments of the present disclosure, a 0.00125% w/v $AgNO_3$ solution was used. In some embodiments of the present disclosure, a metal source solution for creating 210 holes may be between about 0.0000125% w/v $AgNO_3$ and about 0.125% w/v $AgNO_3$. In some embodiments of the present disclosure, a solution of metal nanoparticles or an ionic solution containing the desirable metal, may be deposited onto an intermediate device 250A as an aerosol spray and/or via the method illustrated in FIG. 3 and described below. In some embodiments of the present disclosure, a single droplet of the aerosol spray may have an average diameter of about one micron. Once the solution is applied, it may be dried (not shown in FIG. 2), followed by the application of a dilute etch solution of HF and/or $H_2O_2$ or another oxidating agent, such as $O_2$. For example, in some embodiments of the present disclosure at a combination of HF and $H_2O_2$ at concentration ranges between about 2.0% w/v and about 8.5% w/v and between about 2.0% w/v and about 10.0% w/v, respectively, resulting in the experimentally derived areal densities described below.

In some embodiments of the present disclosure, the depositing 203 and creating 210 of the holes may be achieved by depositing the metal nanoparticles onto the surface, from a solution by any suitable method including electroless plating or other methods such as active plating, use of a supersaturated solution, etc., followed by the application of an etch solution like that described above, which causes the nanoparticles to penetrate into the first temporary layer 207 and the underlying dielectric layer 120, forming the holes 140 and resulting in an intermediate device 250B, as shown in FIG. 2. As described in more detail below, the exemplary method illustrated in FIG. 2 and described above may be applied to both textured surfaces (e.g., randomly textured surfaces) and/or to non-textured surfaces.

In some embodiments of the present disclosure, a textured silicon substrate 110 (and its overlying one or more dielectric layers 120) where the texture includes pyramidal tips, may be exposed to at least one of a mechanical "rub" of the textured surface, chemical processing, and/or other types of processing that is sensitive to the tips of pyramids, which, among other things, may selectively remove intrinsic a-silicon present at the tips of the textured surface, enabling the formation of holes 140 at those points where the a-silicon was removed. More specific examples of this include using an electrochemical etch: using an electric field concentrated on the tips of pyramids and/or optical processing (e.g., laser) that concentrates light on tips, resulting in the removal of intrinsic a-silicon from the tips, creating locations to create holes 140. Thus, this embodiment replaces the hole creation using MACE. Here, methods other than MACE provide point locations where the temporary silicon layer is removed, enabling access to the underlying dielectric layer(s) by a chemical etchant such as HF, to produce holes penetrating the dielectric layer(s).

Figure 3:
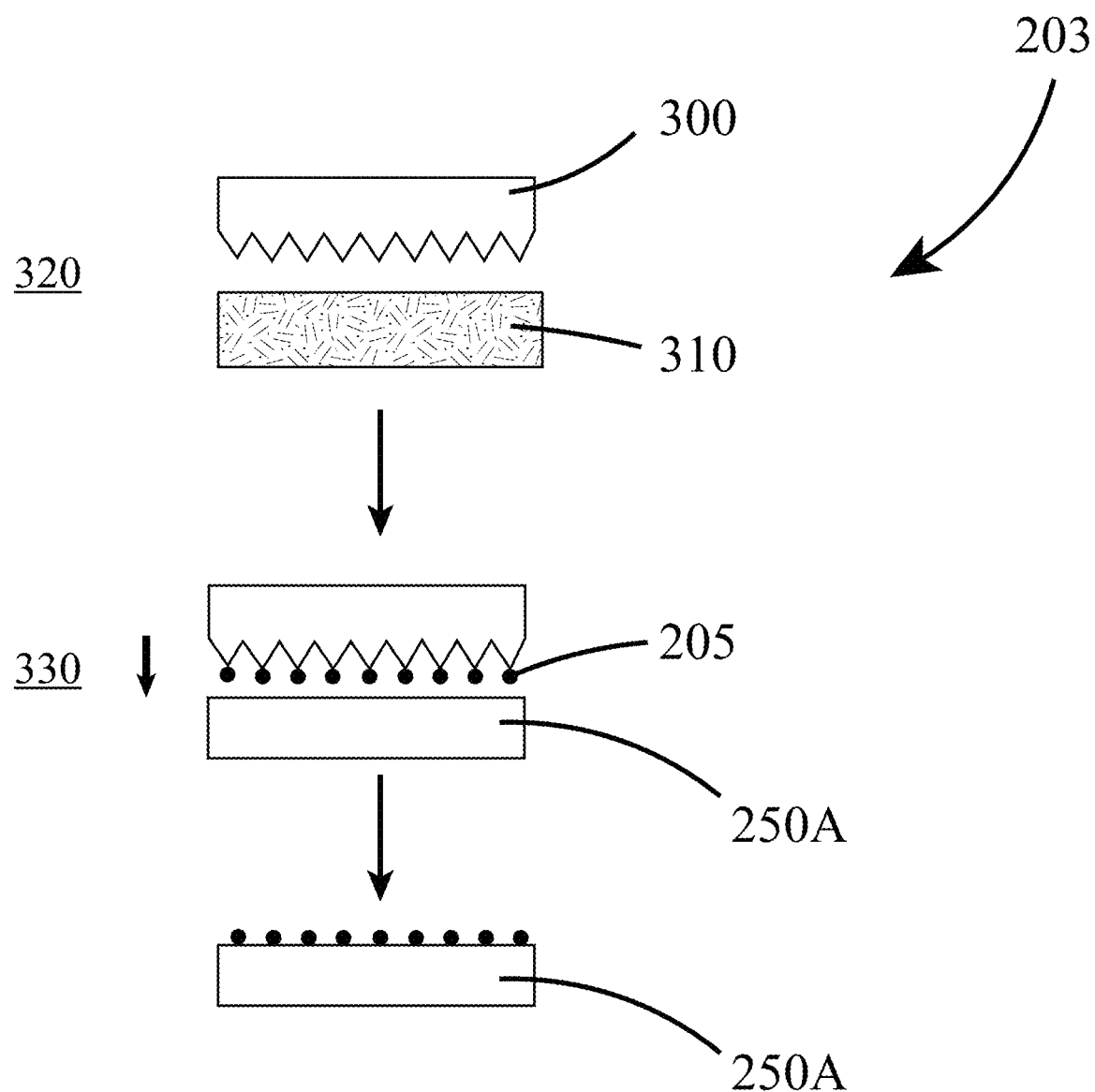
FIG. 3 illustrates a method for depositing metal nanoparticles onto a substrate, according to some embodiments of the present disclosure.

FIG. 3 illustrates another method for the depositing 203 of metal nanoparticles 205 onto an intermediate device 250A, according to some embodiments of the present disclosure. In this exemplary method, a soft, pointed stamp 300 is dipped in a nanoparticle solution 310 and applied to the surface of the first temporary layer 207 of the intermediate device 250A, as shown in FIG. 2. Droplets may attach to the pointed tips of the stamp 300 by engineered wetting. In some embodiments of the present disclosure, a stamp 300 for depositing nanoparticles 205 may be made of polydimethylsiloxane (PDMS), constructed similar to nanoimprint stamps made from an Si master (in this case, the master would be a pyramidal textured silicon wafer. Wetting or non-wetting may be controlled by functionalizing the PDMS stamps surface, using procedures known in the art. For example, self-assembled monolayers (SAMs) can make the surface wettable or non-wettable. Rubbing the stamp can then remove the SAMs from the pyramid tips to make them wettable. Referring again to FIG. 3, this illustrates that the depositing 203 step may be achieved in two separate steps; a first dipping 320 of the stamp 300 into the solution 310 containing nanoparticles 205. With the removal of the stamp 300 from the solution 310, nanoparticles 205 remain on surfaces of the stamp 300 by wetting and/or surface tension.

Next, the nanoparticles 205 may be applied to a surface of the targeted intermediate device, e.g., 250A, by applying 330 at least one of nanoparticles 205 attached to the stamp 300 and/or the nanoparticles 205 and the stamp 300 to the surface of the intermediate device, e.g., 250A. At that point, the method 200 may advance to the creating holes 210 step illustrated in FIG. 2.

Referring again to FIG. 2, in some embodiments of the present disclosure, after a step for creating 210 holes, a method 200 may then proceed with the optional step of perfecting 220 the holes 140. This is because, in some situations, the step of creating 210 holes, e.g., using MACE, may not produce holes that completely penetrate both the dielectric layer 120 and the first temporary silicon layer 207 of intermediate device 250B. Therefore, in some embodiments of the present disclosure, a method 200 may include the optional perfecting 220 step that completes the formation of holes 140 that completely penetrate the dielectric layer(s) 120 (e.g., SiO$_x$) and the first temporary silicon layer 207 (e.g., intrinsic a-silicon and/or intrinsic polycrystalline silicon), as shown in intermediate device 250C. Like the initial creating 210 of holes step, a perfecting 220 step may be achieved by various methods, including chemically assisted etching (e.g., using HF) and reactive ion etching using dielectric selectivity (CF$_4$).

Referring again to FIG. 2, once the holes 140 are formed to the extent desired, a method 200 for producing passivating contacts 105 may proceed with the depositing 230 of a second temporary layer 235 onto the first temporary layer 207 of intermediate device 250C, resulting in intermediate device 250D. In some embodiments of the present disclosure, a second temporary layer 235 may be constructed of a material that includes at least one of a post-transition metal and/or a metalloid. Examples of materials that may be used to construct a second temporary layer 235 include at least one of silicon and at least one dopant as described above (e.g., aluminum, indium, gallium, phosphorous, boron, antimony, etc.). With the depositing 230 of the second temporary layer 235 complete, the exemplary method 200 shown in FIG. 2 proceeds with the treating 240 of the resultant stack (i.e., intermediate device 250D), where the treating 240 results in the transformation of the first temporary layer 207 and the second temporary layer 235 into the intervening layer 130 (e.g., doped silicon) previously described, transforming the intermediate device 250D into the final targeted device 100 having the exemplary passivating contacts 105 illustrated in FIG. 1. As shown in FIGS. 1 and 2, the treating 240 may result in the material derived from at least one of the first temporary layer 207 and/or the second temporary layer 235 and/or its dopants penetrating into the underlying silicon substrate 110, thereby creating penetrating regions 150 of the material making up the final intervening layer 130 within the silicon substrate 110. In some embodiments of the present disclosure, the treating 240 may include heating intermediate device 250D to a temperature between about 500° C. and about 950° C. for a time period between about one second and 10 hours, resulting in the forming of the targeted device 100.

Further, the intervening layer 130 illustrated in FIG. 2 is depicted as a single layer penetrating the dielectric layer 120 and penetrating the underlying silicon substrate layer 110. The single shading implies that this layer has a single uniform final composition resulting from the combining of the first temporary layer 207 (e.g., intrinsic silicon) and the second temporary silicon layer 235 (e.g., doped silicon). In some embodiments of the present disclosure, this may be the case; e.g., the dopant may have an essentially constant concentration throughout the intervening layer 130 and/or the penetrating regions 150. However, in some embodiments of the present disclosure, the combining of the first temporary layer 207 and the second temporary layer 235 during the treating 240 (e.g., elevated temperature annealing) may result in a final intervening layer 130 having a concentration gradient, for example across its thickness in the z-axis direction. Such a gradient may be, for example, a dopant concentration gradient. Similarly, the combining of the first temporary layer 207 and the second temporary layer 235 during the treating 240 may result in a concentration gradient from the interface of intervening layer 130 with the dielectric layer 120 through the holes 140 and into the penetrating regions 150.

In some embodiments of the present disclosure, the devices 100 resulting from the methods 200 described above may result in the manufacture of nanostructured passivating contacts 150 having ~20 nm-sized holes with about 50-100 nm sized penetrating regions 150, i.e., regions containing dopant originating from the intervening layer 130 that diffused through the holes 140 into the silicon substrate 110 during the treating 240 (e.g., annealing), with distances between neighboring penetrating regions in the xz-plane between about 0.1 μm and about 10 μm (referring to FIG. 1, the distance between penetrating regions 150A and 150B). Such devices are envisioned to perform better than incumbent technologies due to their low spreading resistances, which depends on the hole radius r according to Equation 1, $$R_{cont} = \frac{\pi \rho_{waf} r}{4f} \qquad \text{Equation 1}$$

where $R_{cont}$=contact resistivity, $\rho_{waf}$=wafer resistivity, r=hole radius, and f=total area fraction occupied by holes. For the same hole area fraction f making holes of smaller radii will reduce the contact resistivity proportionally to r. Therefore, going from a radius of ~10 microns to a radius of ~10 nm will reduce $R_{cont}$ by ~1,000 times. This means far fewer holes may be needed (less area fraction f) if they are between about 10 nm and about 100 nm in radius. This will result in much better passivation of the contact surface (due to the lesser f value), while still providing good carrier transport.

Figure 4:
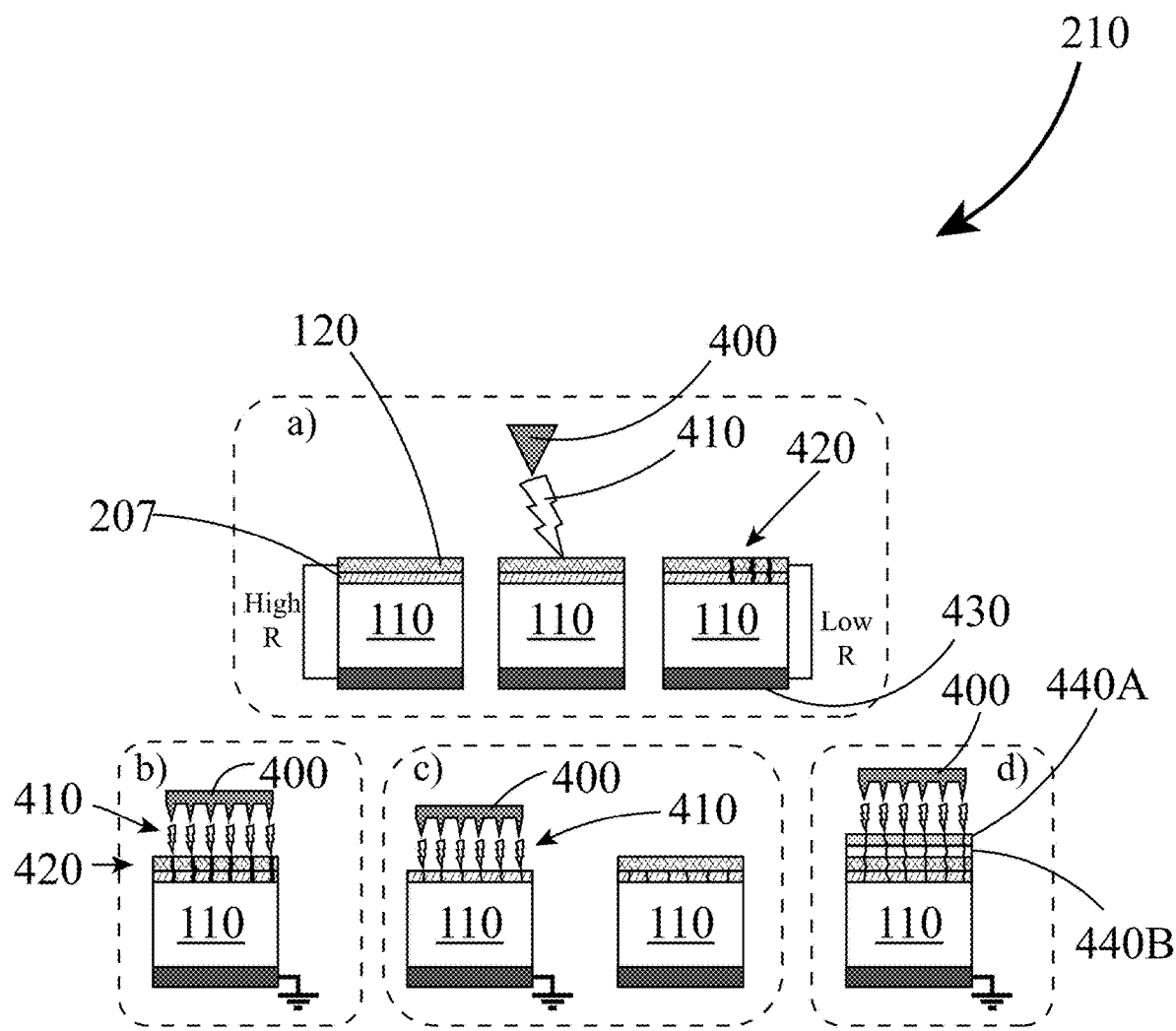
FIG. 4 illustrates a method for creating holes in a device using high voltages, according to some embodiments of the present disclosure.

As shown in FIG. 4, in some embodiments of the present disclosure, the creating 210 holes step of the exemplary method 200 shown in FIG. 2 may be accomplished utilizing an electric field in place of MACE and/or in addition to MACE. In this example, the creating 210 holes step more generally creates conductive pathways capable of conducting charge through at least one of the dielectric layer 120, the first temporary layer 207, and/or the final intervening layer 130 manufactured during the treating 240 step illustrated in FIG. 2. The application of an electric field, for example through the use of a high voltage source 400 (e.g., a Tesla coil), may, among other things, result in the creation of one or more electric arcs 410. For example, as shown in Panel a) of FIG. 4, after the depositing of the first temporary layer 207 onto a dielectric layer 120, cracks, and/or electrically conducting pathways 420, may be formed through both layers of the intermediate device 250A by applying an electric filed across both layers. For example, such a method may use spatially-concentrated high electric fields across both the dielectric layer 120 and the first temporary layer 207 of a-silicon and/or poly-silicon to achieve dielectric breakdown, forming the conductive pathways 420 as cracks and/or "nano-holes" through at least one of the dielectric layer(s) 120 and/or the first temporary layer 207. In some embodiments of the present disclosure, a Tesla coil may be utilized to produce very high voltages at the end of a metal tip.

In some embodiments of the present disclosure, a device 100 may include a passivating contact 105 having a dielectric layer 120, e.g., an oxide layer, that is too thick to efficiently conduct electrical current via quantum mechanical tunneling. Before the electrical field is applied to the sample, the electrical contact between a first temporary silicon layer 207 and an ohmic back contact 430 may be very high, as indicated by "High R" in the left device in panel a) of FIG. 4. After the electrical arc 410 passes through the device (e.g., 250A), as shown in the middle device of panel a) of FIG. 4, the electrical contact may improve by several orders of magnitude (down to <10Ω), as indicated by "Low R" in the right device in panel a) of FIG. 4. Some passivation of the contact structure may be lost where the electric field was positioned over the sample. However, some of the passivation may be restored following the treating 240 step as shown in FIG. 2. Choosing the correct electric field strength to cause dielectric breakdown of the dielectric layer(s) 120, while not causing other damage to the device, is an important aspect of this idea. For example, in some embodiments of the present disclosure, a voltage of about 5 volts may be applied across a 2 nm oxide resulting an electric field of about 5 V/2E-9 m=5E9 V/m field. In some embodiments of the present disclosure, and electric field may be between about 1E6 V/m and about 1E13 V/m.

Panels b), c), and d) of FIG. 4 show a few additional concepts for how conductive pathways 420 penetrating through the thickness of a dielectric layer 120 by the application of an electric field could be implemented in practice. Panel b) shows a high voltage source 400 arranged as an array of conducting spikes (which could be metal or pyramid-etched Si) to direct the electrical arc 410 created by the electric field to specific places on the sample to form dielectric breakdown in the regions under the spikes. The rest of the area remains well-passivated because conducting pathways 420 are not formed where the electric field was not applied. Panel c) shows the same idea as Panel b), but this time electric field to case the dielectric breakdown is applied to the dielectric layer 120 before the first temporary layer 207 (and/or any other conducting layer) is deposited. This method may allow greater control over spatial breakdown placement, because a highly conductive poly-silicon temporary layer 207 may not act as an equipotential plane and may avoid electrical damage to the conducting top layer. It should be noted that breaking down the dielectric layer 120 separately from a conducting layer such as a temporary layer of silicon may allow use of other conducting layers besides and/or in addition to polycrystalline silicon, such as transparent conducting oxides. Panel d) shows that the same concept could be done on an intermediate device having a more complicated stack architecture with additional dielectric layers (e.g., 440A and 440B) deposited onto the first temporary layer 207. As described above, for this method of creating conductive pathways 420, does not necessarily result in the forming of physical cracks and/or holes as defined above, but instead produces electrically conducting pathways formed by electrical breakdown through the materials; e.g., dielectric materials and/or semiconducting materials. Further, in some embodiments of the present disclosure, a thermal treating 240 step (i.e., anneal) may be subsequently applied to repassivate some areas and/or to diffuse dopants into these electrically conductive pathways similar to the treating 240 step described above when describing the method 200 of FIG. 2.

Synthesis & Characterization of Polysilicon on Locally Etched Oxide (PLEO) Passivating Contacts: A silicon substrate characterized by a double-side randomly textured and saw-damage etched (note: saw-damage etched=planarized silicon substrate; versus a textured silicon substrate), phosphorous-doped (n-type), 1-5 Ω·cm resistivity, ~160 µm thick, Cz Si(100) wafers were piranha and RCA cleaned. After etching in HF to clean the wafers, the wafers were oxidized for about 10 minutes in a quartz tube furnace at 800° C. with 6:1 $N_2$:$O_2$ flow. Next, ellipsometry was performed on the resultant n-type c-Si wafer, which demonstrated the presence of a dielectric layer of $SiO_x$ having a thickness of about 2 nm. After the oxidation step to form the dielectric layer, a first temporary layer of intrinsic amorphous hydrogenated silicon (a-Si:H) was deposited on the dielectric layer via plasma-enhanced chemical vapor deposition (PECVD) using a $SiH_4$/$H_2$ capacitively-coupled plasma powered at 13.56 MHz. The flow rates of $SiH_4$ and $H_2$ were 2 and 120 standard $cm^3$/min (sccm), respectively. In addition, the step of depositing the intrinsic a-Si:H layer on the $SiO_x$ layer was performed by placing the intermediate device on a grounded substrate holder and maintained at a temperature of 250° C. with an input power to the plasma source of 12 W, at 1.4 Torr. After completion of the depositing of the first temporary silicon layer (a-Si:H) onto the dielectric layer ($SiO_x$), the resultant intermediate device was immersed in HF to ensure no native oxide was present.

Next, the step of depositing nanoparticles onto the first temporary silicon layer was performed. Silver nanoparticles were electrolessly plated onto the a-Si:H layer by immersing the intermediate device samples for about two minutes in a mixture of 250 µL 2.5% w/v $AgNO_3$ in 500 mL DI $H_2O$ at room temperature and ambient light. Subsequently, the resultant intermediate device samples were dipped in one of the various HF:$H_2O_2$:$H_2O$ solutions for about 5 seconds. In all cases, the HF:$H_2O$ molar ratio was kept approximately constant at 0.59, to perform metal-assisted chemical etching (MACE) to form the holes penetrating at least one of the first temporary layer and/or the dielectric layer. The silver nanoparticles were subsequently removed by soaking the samples in a 4:1:1 $H_2O$:29% $NH_4OH$:30% $H_2O_2$ at 75° C. for 10 min. The samples were then dipped in HF to remove any inadvertent oxide formation that formed during removal of the nanoparticles. In some embodiments of the present disclosure, this HF step may further increase the average diameter of the holes penetrating the dielectric layer.

At this point in this exemplary method, each intermediate device sample (250B and 250C in FIG. 2) was processed further by one of three different procedures: (i) an etch step in 5% tetramethylammonium hydroxide (TMAH) at 60° C. to enable optical microscopy imaging of the areal density of holes in $SiO_x$, (ii) Pt depositing onto the intermediate device by evaporation and focused ion beam for cross-sectional TEM preparation, or (iii) further processing as described above and illustrated in FIG. 2 to fabricate either symmetric test structures or solar cells.

To fabricate p+ poly-Si symmetric test structures, a second temporary layer of boron-doped a-Si:H with a thickness of about 20 nm was deposited (step 230 in FIG. 2) onto the first temporary layer via PECVD using $SiH_4$/$H_2$/$B_2H_6$:$H_2$ (2, 100, and 2 sccm, respectively) at 200° C., 8 W and 1 Torr, where the. For n+ poly-Si symmetric test structures, a second temporary layer of phosphorous-doped a-Si:H having a thickness of about 20 nm was deposited (step 230 in FIG. 2) via PECVD using $SiH_4$/$H_2$/$PH_3$:$H_2$ (2, 100, and 2 sccm, respectively) at 220° C., 8 W and 1 Torr. (Note: These symmetric device structures were used for photoconductance decay experiments using the Sinton tool to measure $iV_{oc}$ and $J_0$ (corresponding to implied open-circuit voltage and recombination parameter, respectively).

Back-junction cells (BJC) were fabricated using the same PECVD conditions as the ones used to fabricate the symmetric test structures just described. Crystallization of the a-Si:H layers (the first and second temporary layers) and dopant drive-in (the treating step 240 illustrated in FIG. 2) were performed via annealing for about 30 minutes at peak temperatures of about 850° C., 900° C., 925° C., or 950° C. in a quartz tube furnace in a $N_2$ atmosphere. The samples were loaded into the furnace, either at 200° C. (the ramp rate was 3.6° C./min) or at the peak temperatures (referred to herein as a "fast ramp"). These annealing steps resulted in exemplary devices corresponding to device 100 illustrated in FIGS. 1 and 2.

Figure 5:
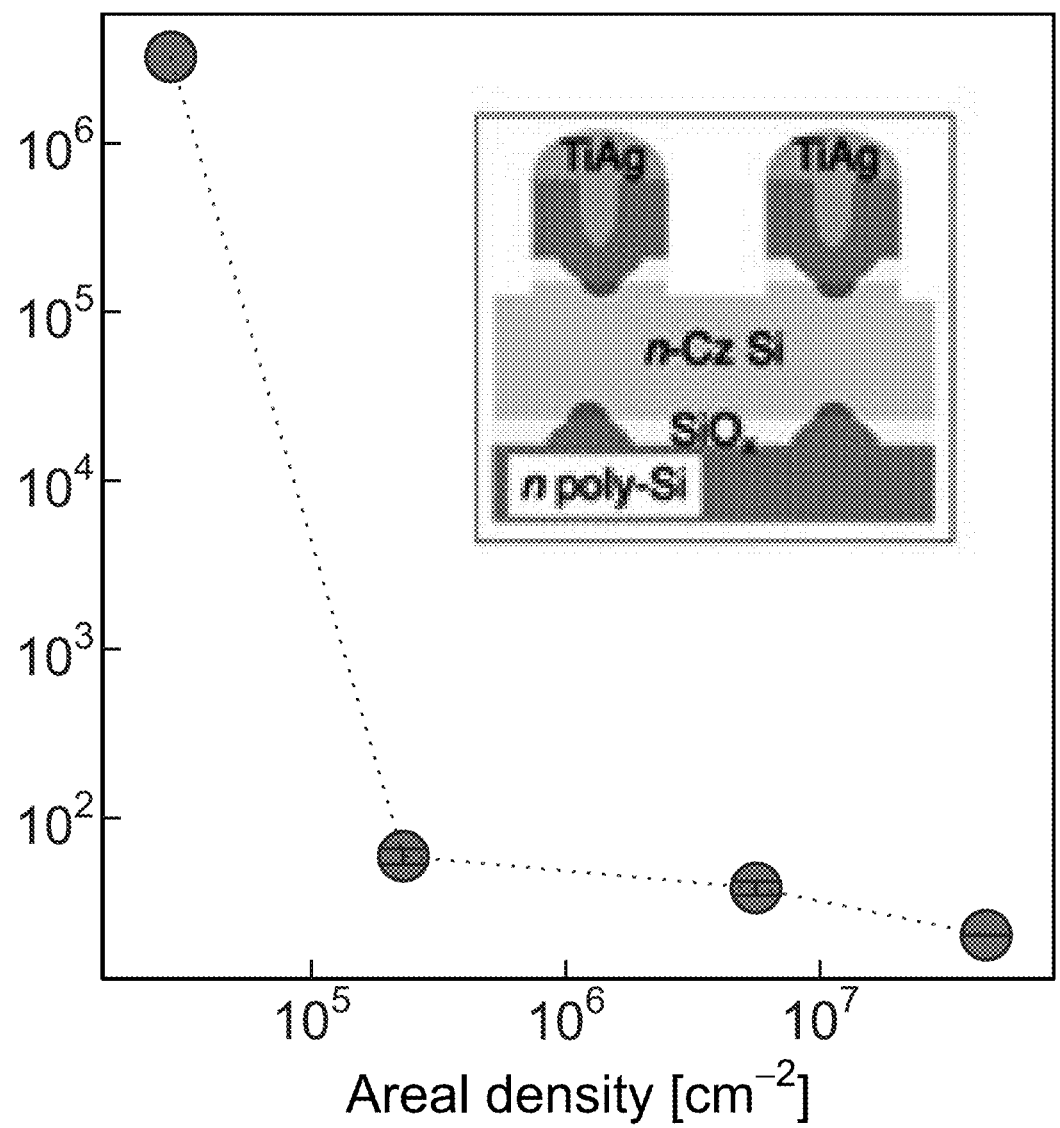
FIG. 5 illustrates specific contact resistivities in mΩ-cm$^2$ as a function of the estimated hole areal density in cm$^{-2}$ of n+ PLEO applied to saw damage etched n-Cz wafers, according to some embodiments of the present disclosure. All samples were annealed at 850 C.

All samples were HF dipped prior to the atomic layer deposition (ALD) of 15 nm of $Al_2O_3$. ALD was followed by annealing in forming gas at 400-450° C. for 1 h, $Al_2O_3$ removal and photoconductance decay measurements using a Sinton tool. This is a standard method for boosting the passivation by diffusing hydrogen into the poly-Si/$SiO_x$ so that the hydrogenated $SiO_x$ passivates better. For contact resistivity measurements, pads for transfer length method (TLM) were deposited to the symmetric test structures containing n+ poly-Si on n-type wafer. TLM measurements were performed before and after undergoing reactive-ion etching using a parallel-plate, capacitively-coupled reactive ion etcher (Samco) operated with 5 sccm of $SF_6$ flow at 30 W radio-frequency power at a pressure of ~0.12 Torr for 1 min, during which the Ag TLM pattern served as etching mask. TLM data AFTER this reaction-ion etching is illustrated in FIG. 5—the structure shown in the inset is the result of the reactive-ion etching of the poly-Si surrounding the metal pads) For J-V measurements using a Solar simulator under 1 Sun and room temperature conditions, gridlines and blanket metal were thermally evaporated to the front (~3 μm TiAg) and rear (~1 μm TiAg) of the BJC. After metal evaporation, the front sides of the solar cells underwent $SiN_y$ PECVD using $SiH_4/NH_3$ (4 and 24 sccm, respectively) at 250° C., 4 W and 0.45 Torr.

Figure 6:
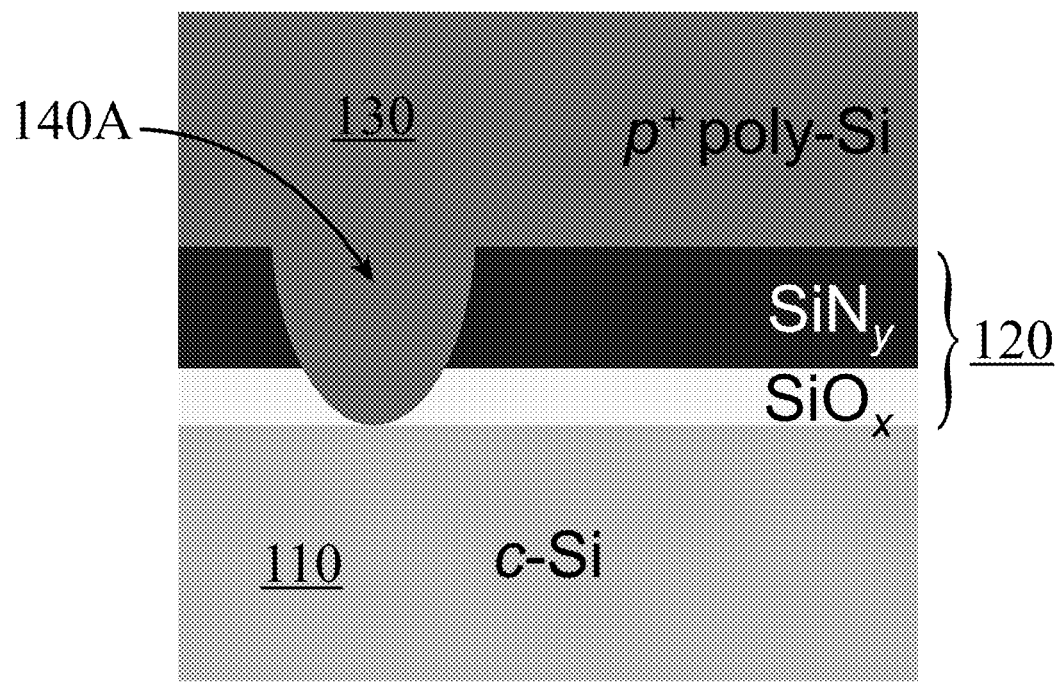
FIG. 6 illustrates a Poly-Si on Locally Etched SiN$_y$/SiO$_x$ (PLENO) device, according to some embodiments of the present disclosure.
Figure 7:
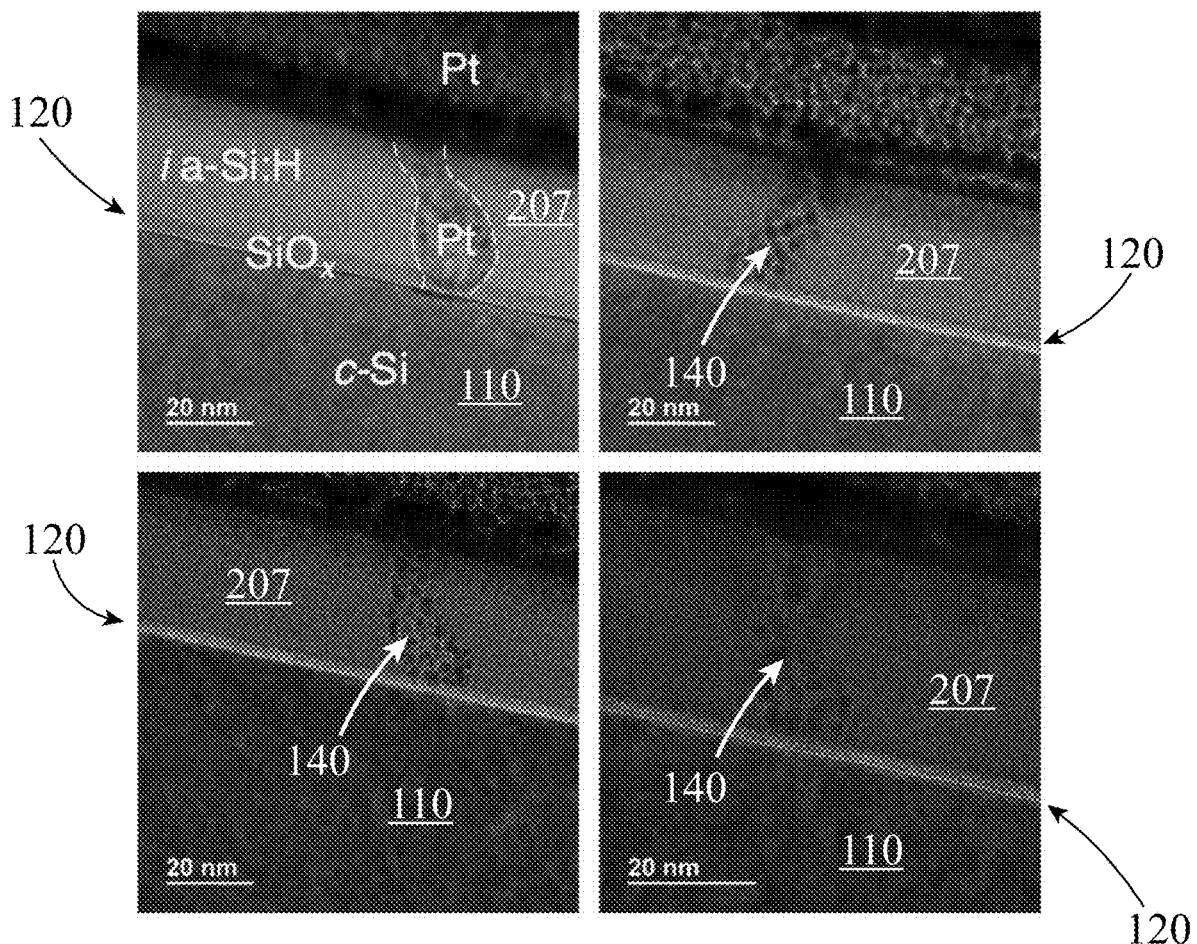
FIG. 7 illustrates transmission electron microscpopy (TEM) images of Pt-decorated holes in intrinsic a-Si:H/SiO$_x$, according to some embodiments of the present disclosure.
Figure 8:
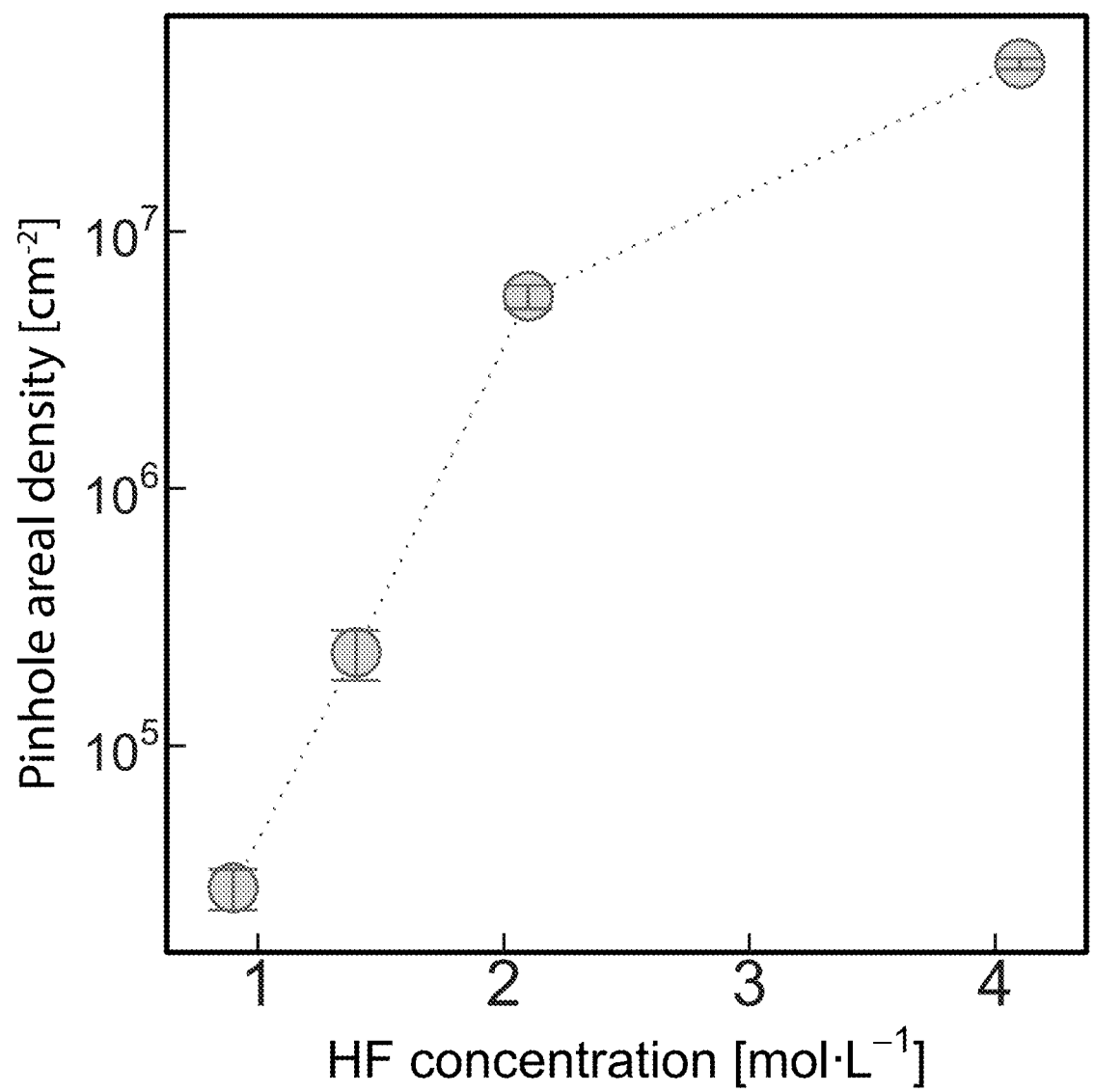
FIG. 8 illustrates estimated hole areal density in cm$^{-2}$ versus HF concentration in mol/L, according to some embodiments of the present disclosure. The estimations were based off polished intrinsic a-Si:H/SiO$_x$ structures 250C after etch in TMAH.

Synthesis & Characterization of Polysilicon on Locally Etched Oxide/Nitride (PLENO) Passivating Contacts: A silicon substrate characterized by saw-damage etched, phosphorous- or boron doped (note: phosphorous wafer for Sinton measurements; boron wafer for resistivity TLM measurements), 1-5 Ω·cm resistivity, ~160 μm thick, Cz Si(100) wafers were piranha and RCA cleaned. p-type PLENO symmetric test structures were fabricated using identical processing steps as in the synthesis of PLEO contacts, except for double the thickness of boron-doped a-Si:H, and an additional step to deposit a second dielectric layer of silicon nitride (SiNx) having a thickness of about 10 nm onto the first dielectric layer silicon oxide, immediately after completing oxidation of the silicon substrates. The SiNx dielectric layer was grown via PECVD using $SiH_4/NH_3$ (4 and 24 sccm, respectively) at 200° C., 4 W and 0.4 Torr. The annealing peak temperature of 925° C. for the treating step (240 in FIG. 2) was achieved using a ramp rate of 3.6° C./min from a starting temperature of 200° C. Photoconductance decay and TLM measurements were conducted on the resultant devices. FIG. 6 illustrates a cartoon of the resultant final structure (i.e., device 100). Micrographs of exemplary Pt-decorated holes formed in an intermediate device (250C in FIG. 2) constructed of intrinsic a-Si:H/$SiN_y$/$SiO_x$ micrographs are shown in FIG. 7. These TEM devices were treated with etching solutions corresponding to the highest HF concentrations, resulting in the hole areal densities illustrated in FIG. 8. PLENO passivating contact resistivity and $iV_{oc}$ data are summarized in Table 1 below. The terms "solB" and "solC" refer to samples corresponding to the second and third highest HF concentrations illustrated in FIG. 8.

TABLE 1

PLENO Physical Properties and Performance Metrics

Sample ID: CS170*_sol_B_post-TMAH-etch

| Set ID | Pad-to-pad resistance [ohm] | Spec. contact resistivity* [ohm-cm²] | Etch-pit scanned area [cm²] | Etch-pit count | Etch-pit areal density [cm⁻²] | Single-hole contact resistivity [ohm] | Notes |
| --- | --- | --- | --- | --- | --- | --- | --- |
| 1 | 47.7 | 1.24 | — | — | — | — | |
| 2 | 52.9 | 1.38 | 0.000009 | 524 | $5.8 \times 10^7$ | $8.0 \times 10^7$ | potentially undercounted ech-pits |
| 3 | 53.3 | 1.39 | 0.000025 | 1567 | $6.3 \times 10^7$ | $8.7 \times 10^7$ | potentially undercounted etch-pits |
| 4 | 831 | 21.6 | 0.000025 | 620 | $2.5 \times 10^7$ | $5.4 \times 10^8$ | — |
| 5 | 846.7 | 22.0 | 0.000025 | 741 | $3.0 \times 10^7$ | $6.5 \times 10^8$ | — |
| 6 | — | — | — | — | — | — | — |

Sample ID: CS163**_sol_C-post-TMAH-etch

| Set ID | Pad-to-pad resistance [ohm] | Spec. contact resistivity* [ohm-cm²] | Etch-pit scanned area [cm²] | Etch-pit count | Etch-pit areal density [cm⁻²] | Single-hole contact resistivity [ohm] | Notes |
| --- | --- | --- | --- | --- | --- | --- | --- |
| 1 | 6912 | 179.7 | 0.00049475 | 131 | $2.7 \times 10^5$ | $4.8 \times 10^7$ | — |
| 2 | 60884 | 1583.0 | 0.00049475 | 23 | $4.7 \times 10^4$ | $7.4 \times 10^7$ | — |
| 3 | 28879 | 750.9 | 0.00049475 | 75 | $1.5 \times 10^5$ | $1.1 \times 10^8$ | — |
| 4 | 98 | 2.55 | 0.000025 | 631 | $2.5 \times 10^7$ | $6.4 \times 10^7$ | — |
| 5 | 77.3 | 2.01 | 0.000025 | 853 | $3.4 \times 10^7$ | $6.9 \times 10^7$ | — |
| 6 | 74.2 | 1.93 | 0.000025 | 926 | $3.7 \times 10^7$ | $7.2 \times 10^7$ | — |

*CS170 = 709 mV, 1.3 fA/cm² p PLENO on p-type Si Cz - sister samples on n Cz measured 737 mV 1 fA/cm² & 732 mV 2.1 fA/cm².

**CS163 = 710 mV, 1.9 fA/cm² p PLENO on p-type Si Cz - sister samples on n Cz measured 744 mV 0.5 fA/cm² & 733 mV 1.9 fA/cm².

Figure 13:
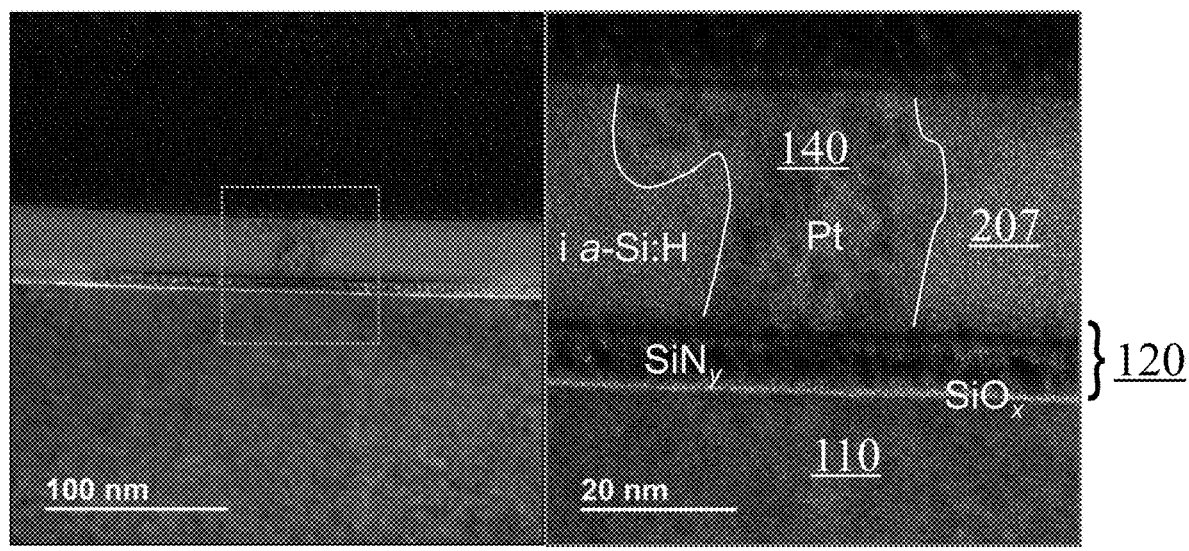
FIG. 13 illustrates electron microscopy images obtained of a Pt-decorated hole in intrinsic a-Si:H/SiN$_y$/SiO$_x$, according to some embodiments of the present disclosure.

FIG. 13 illustrates electron microscopy images of Pt-decorated holes in intrinsic a-Si:H/SiN$_y$/SiO$_x$, according to some embodiments of the present disclosure. The left panel illustrates the holes resulting from the TMAH technique described herein. The right panel illustrates images that show a hole penetrating a first temporary layer 207 and two underlying dielectric layers 120, a first constructed of silicon nitride and a second of silicon oxide, according to some embodiments of the present disclosure. This exemplary dielectric stack of silicon oxide and silicon nitride allows for extremely low $J_0$ of boron-doped polysilicon contacts. In the best cases, 0.2 fa/cm$^2$ and 6.7 fa/cm$^2$ were achieved on saw damage etched and double side textured n-Cz wafers, respectively, with corresponding iVOCs of 737 mV and 721 mV, respectively. In these cross-sectional TEM, over-etching of the dielectric stack resulted in the formation of undercuts underneath the not-etched intrinsic a-Si:H.

Hole Areal Density Control & Hole Imaging.

Figure 9:
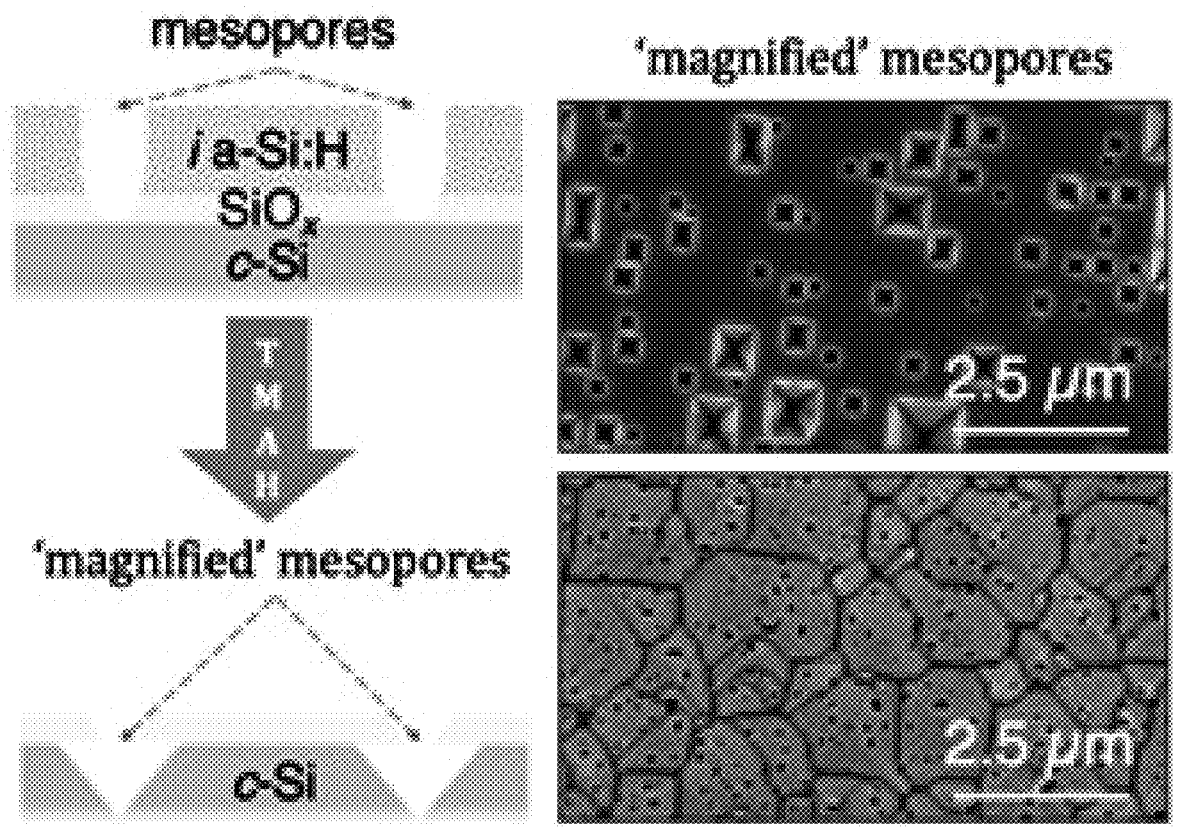
FIG. 9 illustrates a schematic of TMAH etching procedure to 'magnify' holes present in SiO$_x$ (left), according to some embodiments of the present disclosure. Etching of underlying c-Si results in features that can be easily observed with electron or optical microscopes. SEM micrographs of TMAH etch pits in polished (right, top) and randomly textured (right, bottom) samples.

The reduction of Ag$^+$ ions at the surface of the first temporary layer 207 of intermediate device 250A of FIG. 2 relies on the intermediate device supplying conduction band electrons to the AgNO$_3$ aqueous solution, or alternatively, hole injection from Ag$^+$ onto the device valence band. Experiments determined that longer deposition times led to the Ostwald ripening of the Ag NP (SEM not shown). After completion of hole formations via MACE (step 210 in FIG. 2), following the Ag NP removal step as described above, the highly selective Si etchant TMAH was utilized to remove the intrinsic a-Si:H (i.e., the first temporary layer 207) and etch the underlying c-Si silicon substrate exposed by the chemically formed holes in a-Si:H and holes in SiO$_x$ (see left panel of FIG. 9). The etch pits created were imaged with SEM (see right panel of FIG. 9), and several micrographs were utilized to estimate the areal density of holes (see FIG. 8). By diluting the hole etching solution (HF:H$_2$O$_2$:H$_2$O) while maintaining the HF:H$_2$O$_2$ molar ratio approximately constant, a significant decrease in the etch pit areal density was observed: over the range of ~1-4 mol/L of HF, the areal density varied over the range of ~$10^4$-$10^7$ cm$^{-2}$. Without being bound by theory, diluting the hole etching solution may result in smaller particles becoming embedded in a partially etched a-Si:H first temporary layer 207, due to a reduction of their etching rate caused by a smaller etching front. (Note: As used herein, the term "etch pit" is not equivalent to a hole. Etch pits result from the TMAH technique described above and are used to measure the areal density of the holes present in the dielectric layer. This TMAH is a destructive technique and thus is not part of the fabrication of the passivating contacts; it is simply a technique that enables counting the holes formed in the dielectric layer.)

Figure 10:
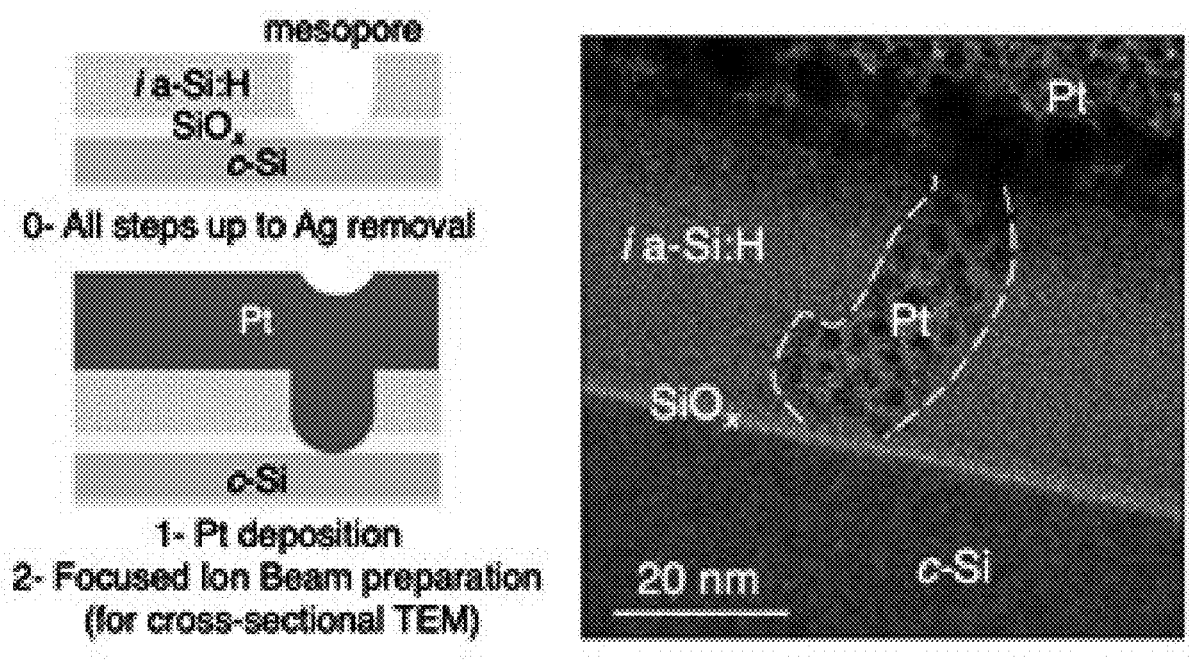
FIG. 10 illustrates a schematic of cross-sectional TEM sample preparation (left), according to some embodiments of the present disclosure. Cross-sectional TEM of a ~15 nm-wide mesopore decorated with Pt (right), according to some embodiments of the present disclosure.

For hole cross-sectional imaging, following the Ag NP removal step, the samples underwent Pt e-beam deposition and focused ion beam (see the left panel of FIG. 10). The Pt deposition resulted in holes becoming filled with Pt, enabling easy contrast between the holes the surrounding medium. The cross-sectional TEM image shown in the left panel of FIG. 10 corresponds to a sample that underwent an etching condition that resulted in ~$10^8$ cm$^{-2}$ etch pit areal density. While the SiO$_x$ underneath the hole looks seemingly intact, post-RIE specific contact resistivity TLM analysis performed on n+ PLEO symmetric test structures measured 29.4±1.4 mΩ-cm$^2$.

PLEO Symmetric Test Structures: Passivation & Specific Contact Resistivity.

Figure 11:
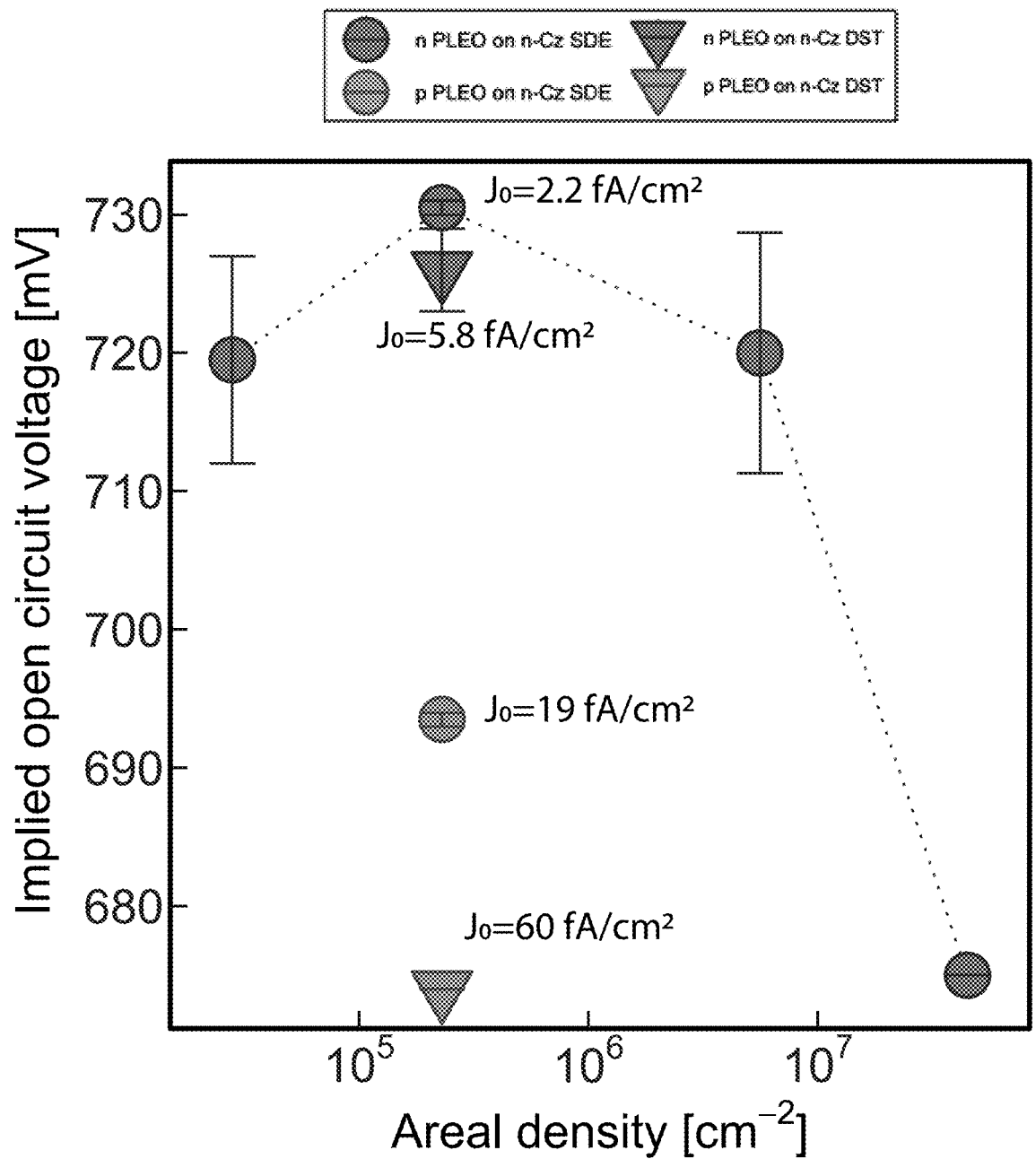
FIG. 11 illustrates implied open circuit voltage at 1 Sun as a function of the estimated hole areal density in cm$^{-2}$, according to some embodiments of the present disclosure. Note that the hole areal density estimations were based off polished TMAH-etched samples. All samples were annealed at 850° C., except for: n-PLEO on n-DST (3.6° C./min ramp to 900° C.), and p-PLEO on n-DST (fast ramp to 950° C.).

FIG. 11 illustrates the implied open circuit voltage (iV$_{OC}$) as a function of the estimated hole areal density of various symmetric n+ and p+ PLEO on n-Cz test devices. In n+ PLEO applied to saw damage etched (SDE) wafers, the iV$_{oc}$ remained above ~720 mV until the hole areal density became too high (~$10^7$ cm$^{-2}$) to allow for the passivation to be preserved, resulting in iV$_{OC}$ below 680 mV; at the moderate hole areal density of ~$10^5$ cm$^{-2}$, the recombination parameter $J_0$ was 2.2 fA/cm$^2$, while applying n+ PLEO to double-side (randomly) textured (DST) wafers, the $J_0$ was 5.8 fA/cm$^2$. At about $10^5$ cm$^{-2}$, p+ PLEO applied to SDE and DST wafers achieved 19 and 60 fA/cm$^2$, respectively.

FIG. 5 illustrates the calculated specific contact resistivities, corresponding to the subtraction of post-ME and pre-RIE specific passivating contact resistivities measured with TLM analysis (except for ~$10^4$ cm$^{-2}$, in which an estimation was made possible via a single pad-to-pad resistance measurement). The specific passivating contact resistivity decreased over the range of ~$10^4$-$10^7$ cm$^{-2}$ hole areal density. Without being bound by theory, it is worth noting that if the hole diameter remained constant over the range of hole areal densities studied, one might expect an order of magnitude change of hole areal density to result in an order of magnitude change in the specific contact resistivity; the observed small change in specific contact resistivity over the range of ~$10^5$-$10^7$ cm$^{-2}$ is contrary to that notion, and consistent with a hypothesis that the average hole size increases as the hole etching solution becomes more diluted.

PLEO Back-Junction Solar Cells on n-Cz.

Figure 12:
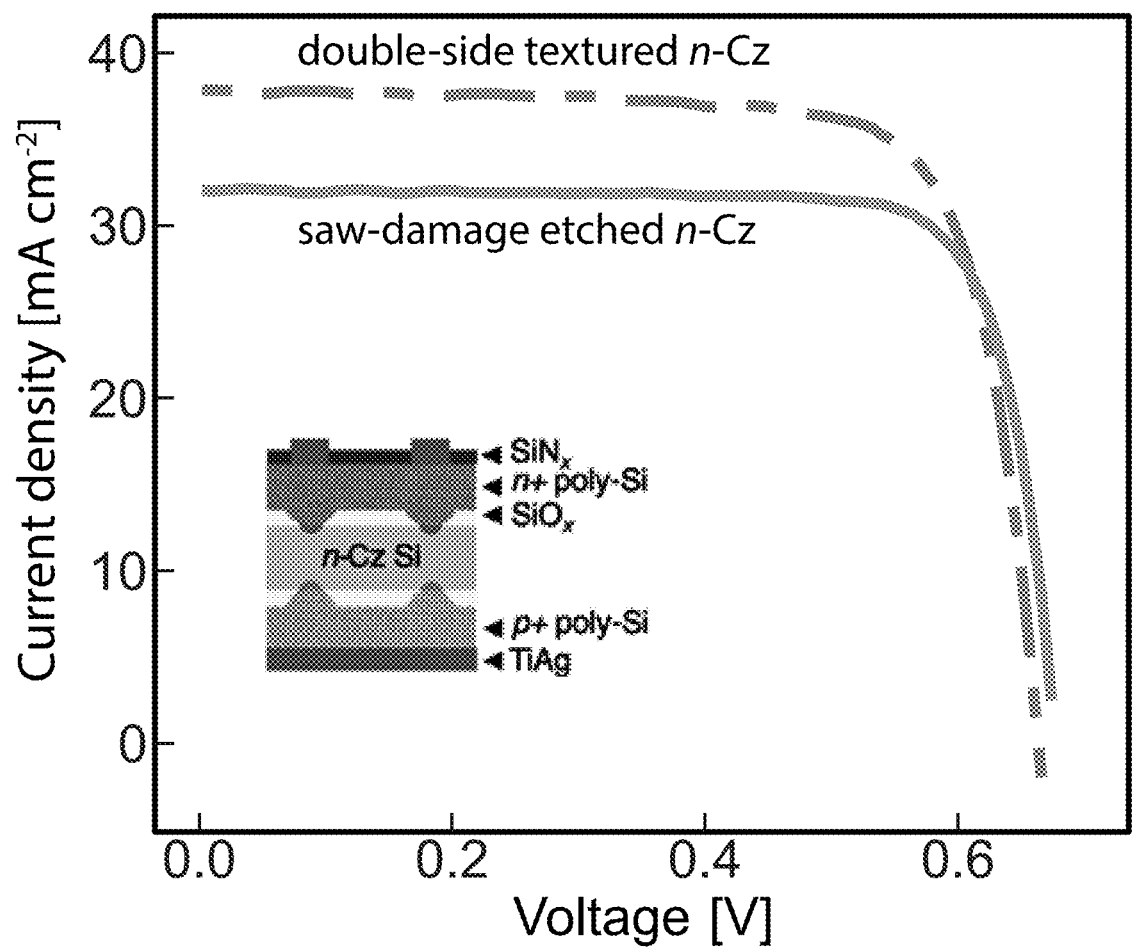
FIG. 12 illustrates J-V curves at 1 Sun for PLEO back-junction solar cells on n-Cz saw-damage etched (SDE) and double-side textured (DST) wafers, after (forming gas annealing) FGA step, according to some embodiments of the present disclosure.

Using a moderate hole areal density of ~$10^5$ cm$^{-2}$, solar cells were fabricated using the 3.6° C./min ramp rate to 925° C. annealing schedule. The efficiencies achieved for the cells based on double-sided textured and saw-damage etched n-Cz were 18.6 and 16.3%, respectively. The rear of these samples containing solar cells consisted of a 4 cm$^2$ device area that was surrounded by an 11 cm$^2$ intrinsic a-Si:H area that was not capped by a doping layer. To cap the holes present in this surrounding intrinsic a-Si:H, the devices underwent Al$_2$O$_3$ ALD followed by 5 min 400° C. forming gas annealing (FGA). The J-V parameters measured after each of these steps can be seen under Table 2, and the final J-V curves are illustrated in FIG. 12.

TABLE 2

| | | J-V parameters of PLEO solar cells after metallization, Al$_2$O$_3$ ALD and FGA. | | | | | | | | | | |
|---|---|---|---|---|---|---|---|---|---|---|---|---|
| | | Efficiency [%] | | | FF [%] | | | V$_{OC}$ [mV] | | | J$_{SC}$ [m Ω cm$^{-2}$] | | |
| ID | Step | — | ALD | FGA | — | ALD | FGA | — | ALD | FGA | — | ALD | FGA |
| | SDE | 16.3 | 16.3 | 17.3 | 73.4 | 75.2 | 79.8 | 679 | 680 | 678 | 32.6 | 31.8 | 32.0 |
| | DST | 18.6 | 19.4 | 19.2 | 73.8 | 75.9 | 76.2 | 673 | 675 | 665 | 37.4 | 37.8 | 37.8 |

In summary, the present disclosure describes a novel method for manufacturing hole-enabled poly-Si passivating contacts, for example poly-Si on locally etched $SiO_x$ (PLEO) passivating contacts. Using MACE at room temperature, holes can be formed across a stack of intrinsic a-Si:H and $SiO_x$; the holes can then be filled with doped a-Si:H and subsequently annealed for dopant drive-in, activation, and crystallization into poly-Si. Symmetric test structures of n+ PLEO contacts achieved $J_0$ of 2.2 and 5.8 $fA/cm^2$ on saw-damage etched (SDE) and double-side textured (DST) n-type Cz-Si. Due to the detrimental effects on boron on the interfacial $SiO_x$, symmetric test structures of p+ PLEO achieved 19 and 60 $fA/cm^2$ on SDE and DST n-type Cz-Si, respectively. As shown herein, the decoupling of the hole formation process from the passivating scheme of choice has the potential to enable novel, more effective forms of passivating contacts, such as poly-Si on locally etched $SiN_y/SiO_x$ (PLENO). In-line MACE industrial equipment that is utilized for the purpose of texturing multicrystalline Si wafers makes the fabrication process of PLEO contacts tangible in industrial settings.

EXAMPLES OF PASSIVATING CONTACTS

Example 1. A passivating contact comprising: a dielectric layer comprising a first material; an intervening layer comprising a second material; and a substrate comprising a semiconductor, wherein: the dielectric layer is positioned between the substrate and the intervening layer, the dielectric layer has a first thickness, the substrate has a second thickness, plurality of conductive pathways comprising the second material pass through the first thickness, the second material penetrates into the second thickness forming a plurality of penetrating regions within the substrate, and the plurality of conductive pathways are configured to allow current to pass through the first thickness.

Example 2. The passivating contact of Example 1, wherein the semiconductor comprises at least one of silicon, a III-V alloy, a perovskite, cadmium, or tellurium.

Example 3. The passivating contact of either Example 1 or Example 2, wherein the substrate comprises a planarized surface.

Example 4. The passivating contact of any one of Examples 1-3, wherein the substrate comprises a textured surface.

Example 5. The passivating contact of any one of Examples 1-4, wherein the second thickness (of the silicon substrate) is between about 0.1 μm and about 1000 μm.

Example 6. The passivating contact of any one of Examples 1-5, wherein the substrate comprises silicon.

Example 7. The passivating contact of any one of Examples 1-6, wherein each penetrating region penetrates between about 1 nm and about 1000 nm into the second thickness (of the silicon substrate), or between about 1 nm and 100 nm, or between about 1 nm and about 10 nm.

Example 8. The passivating contact of any one of Examples 1-7, wherein the first material has a band gap greater than about 2 eV.

Example 9. The passivating contact of any one of Examples 1-8, wherein the band gap is between about 2 eV and about 20 eV.

Example 10. The passivating contact of any one of Examples 1-9, wherein the first material is configured to passivate the substrate.

Example 11. The passivating contact of any one of Examples 1-10, wherein the first material comprises at least one of an oxide, a nitride, an amorphous silicon, or a carbide.

Example 12. The passivating contact of any one of Examples 1-11, wherein the first material comprises at least one of a silicon oxide, an aluminum oxide, a titanium oxide, a silicon nitride, a silicon carbide, a silicon oxynitride, an indium oxide, or a tin oxide.

Example 13. The passivating contact of any one of Examples 1-12, wherein the first material comprises at least one of a silicon oxide or a silicon nitride.

Example 14. The passivating contact of any one of Examples 1-13, wherein the first thickness (of the dielectric layer) is between about 1.0 nm and about 200 nm or between about 1.9 nm and about 50.0 nm or between about 2.1 nm and about 10 nm.

Example 15. The passivating contact of any one of Examples 1-14, wherein: the dielectric layer comprises a first layer and a second layer, and the second layer is positioned between the first layer and the substrate.

Example 16. The passivating contact of any one of Examples 1-15, wherein the first layer (of the dielectric layer) comprises a silicon nitride and the second layer (of the dielectric layer) comprises a silicon oxide.

Example 17. The passivating contact of any one of Examples 1-16, wherein the second material (of the intervening layer) comprises at least one of a metal, post-transition metal, a metalloid, or a non-metal.

Example 18. The passivating contact of any one of Examples 1-17, wherein the second material (of the intervening layer) comprises silicon.

Example 19. The passivating contact of any one of Examples 1-18, wherein the second material (of the intervening layer) comprises polycrystalline silicon.

Example 20. The passivating contact of any one of Examples 1-19, wherein the second material (of the intervening layer) comprises amorphous silicon.

Example 21. The passivating contact of any one of Examples 1-20, wherein the second material (of the intervening layer) is doped.

Example 22. The passivating contact of any one of Examples 1-21, wherein the second material (of the intervening layer) is doped with a p-type dopant.

Example 23. The passivating contact of any one of Examples 1-22, wherein the p-type dopant comprises at least one of boron, aluminum, gallium, or indium.

Example 24. The passivating contact of any one of Examples 1-23, wherein the second material (of the intervening layer) is doped with an n-type dopant.

Example 25. The passivating contact of any one of Examples 1-24, wherein the n-type dopant comprises at least one of antimony or phosphorous.

Example 26. The passivating contact of any one of Examples 1-25, wherein the second material (of the intervening layer) comprises at least one of silicon, aluminum, indium, gallium, phosphorous, boron, arsenic, or antimony.

Example 27. The passivating contact of any one of Examples 1-26, wherein the second material (of the intervening layer) comprises aluminum.

Example 28. The passivating contact of any one of Examples 1-27, wherein the second material (of the intervening layer) comprises an alloy of aluminum and silicon.

Example 29. The passivating contact of any one of Examples 1-28, wherein each conductive pathway comprises at least one of a hole, a crack, or fissure at least partially filled with the second material (of the intervening layer).

Example 30. The passivating contact of any one of Examples 1-29, wherein each hole has a diameter between one nm and about one micron or between about one nanometer and about one micron, or between about 2 nm and about 50 nm.

Example 31. The passivating contact of any one of Examples 1-30, wherein each hole is at a distance between about 100 nm and about 10 μm from a closest neighboring hole.

Example 32. The passivating contact of any one of Examples 1-31, wherein each hole may penetrate the first thickness (of the dielectric layer) at an angle substantially perpendicular to the dielectric layer.

Example 33. The passivating contact of any one of Examples 1-32, wherein each hole may penetrate the first thickness (of the dielectric layer) at an angle substantially non-perpendicular to the dielectric layer.

Example 34. The passivating contact of any one of Examples 1-33, wherein each hole has a cross-sectional shape that is substantially the shape of a circle, an oval, a triangle, a square, a rectangle, or a polygon.

Example 35. The passivating contact of any one of Examples 1-34, wherein a concentration of holes penetrating the first thickness (of the dielectric layer) is between 1e4 holes/cm$^2$ and about 1e8 holes/cm$^2$ or about between about 1e4 holes/cm$^2$ and about 1e6 holes/cm$^2$.

Example 36. The passivating contact of any one of Examples 1-35, wherein the holes are positioned in a non-random pattern on a surface of the dielectric layer.

Example 37. The passivating contact of any one of Examples 1-36, wherein the holes are positioned in a random pattern on a surface of the dielectric layer.

Example 38. The passivating contact of any one of Examples 1-37, wherein each crack or fissure has a characteristic width between about one nanometer and about one micron, or between about 2 nm and about 200 nm.

Example 39. The passivating contact of any one of Examples 1-38, further comprising a metal layer, wherein the intervening layer is positioned between the metal layer and the substrate.

Example 40. The passivating contact of any one of Examples 1-39, wherein the metal layer is constructed of a metal comprising at least one of aluminum, silver, gold, titanium, molybdenum, copper, or nickel.

Examples of Devices:

Example 1. A device comprising: a substrate comprising a semiconductor; and a passivating contact comprising: a dielectric layer comprising a first material; an intervening layer comprising a second material; and a portion of the substrate, wherein: the dielectric layer is positioned between the substrate and the intervening layer, the dielectric layer has a first thickness, the substrate has a second thickness, a plurality of conductive pathways comprising the second material pass through the first thickness, the second material penetrates into the second thickness forming a plurality of penetrating regions within the substrate, and the plurality of conductive pathways are configured to allow current to pass through the first thickness.

Example 2. The device of Example 1, wherein the semiconductor comprises at least one of silicon, a III-V alloy, a perovskite, cadmium, or tellurium.

Example 3. The device of either Example 1 or Example 2, wherein the substrate comprises a planarized surface.

Example 4. The device of any one of Examples 1-3, wherein the substrate comprises a textured surface.

Example 5. The device of any one of Examples 1-4, wherein the second thickness (of the silicon substrate) is between about 0.1 μm and about 1000 μm.

Example 6. The device of any one of Examples 1-5, wherein the substrate comprises silicon.

Example 7. The device of any one of Examples 1-6, wherein each penetrating region penetrates between about 1 nm and about 1000 nm into the second thickness (of the silicon substrate), or between about 1 nm and 100 nm, or between about 1 nm and about 10 nm.

Example 8. The device of any one of Examples 1-7, wherein the first material has a band gap greater than about 2 eV.

Example 9. The device of any one of Examples 1-8, wherein the band gap is between about 2 eV and about 20 eV.

Example 10. The device of any one of Examples 1-9, wherein the first material is configured to passivate the substrate.

Example 11. The device of any one of Examples 1-10, wherein the first material comprises at least one of an oxide, a nitride, an amorphous silicon, or a carbide.

Example 12. The device of any one of Examples 1-11, wherein the first material comprises at least one of a silicon oxide, an aluminum oxide, a titanium oxide, a silicon nitride, a silicon carbide, a silicon oxynitride, an indium oxide, or a tin oxide.

Example 13. The device of any one of Examples 1-12, wherein the first material comprises at least one of a silicon oxide or a silicon nitride.

Example 14. The device of any one of Examples 1-13, wherein the first thickness (of the dielectric layer) is between about 1.0 nm and about 200 nm or between about 1.9 nm and about 50.0 nm or between about 2.1 nm and about 10 nm.

Example 15. The device of any one of Examples 1-14, wherein: the dielectric layer comprises a first layer and a second layer and the second layer is positioned between the first layer and the substrate.

Example 16. The device of any one of Examples 1-15, wherein the first layer (of the dielectric layer) comprises a silicon nitride and the second layer (of the dielectric layer) comprises a silicon oxide.

Example 17. The device of any one of Examples 1-16, wherein the second material (of the intervening layer) comprises at least one of a metal, post-transition metal, a metalloid, or a non-metal.

Example 18. The device of any one of Examples 1-17, wherein the second material (of the intervening layer) comprises silicon.

Example 19. The device of any one of Examples 1-18, wherein the second material (of the intervening layer) comprises polycrystalline silicon.

Example 20. The device of any one of Examples 1-19, wherein the second material (of the intervening layer) comprises amorphous silicon.

Example 21. The device of any one of Examples 1-20, wherein the second material (of the intervening layer) is doped.

Example 22. The device of any one of Examples 1-21, wherein the second material (of the intervening layer) is doped with a p-type dopant.

Example 23. The device of any one of Examples 1-22, wherein the p-type dopant comprises at least one of boron, aluminum, gallium, or indium.

Example 24. The device of any one of Examples 1-23, wherein the second material (of the intervening layer) is doped with an n-type dopant.

Example 25. The device of any one of Examples 1-24, wherein the n-type dopant comprises at least one of antimony or phosphorous.

Example 26. The device of any one of Examples 1-25, wherein the second material (of the intervening layer) comprises at least one of silicon, aluminum, indium, gallium, phosphorous, boron, arsenic, or antimony.

Example 27. The device of any one of Examples 1-26, wherein the second material (of the intervening layer) comprises aluminum.

Example 28. The device of any one of Examples 1-27, wherein the second material (of the intervening layer) comprises an alloy of aluminum and silicon.

Example 29. The device of any one of Examples 1-28, wherein each conductive pathway comprises at least one of a hole, a crack, or fissure at least partially filled with the second material (of the intervening layer).

Example 30. The device of any one of Examples 1-29, wherein each hole has a diameter between one nm and about one micron or between about one nanometer and about one micron, or between about 2 nm and about 50 nm.

Example 31. The device of any one of Examples 1-30, wherein each hole is at a distance between about 100 nm and about 10 μm from a closest neighboring hole.

Example 32. The device of any one of Examples 1-31, wherein each hole may penetrate the second thickness (of the dielectric layer) at an angle substantially perpendicular to the dielectric layer.

Example 33. The device of any one of Examples 1-32, wherein each hole may penetrate the second thickness (of the dielectric layer) at an angle substantially non-perpendicular to the dielectric layer.

Example 34. The device of any one of Examples 1-33, wherein each hole has a cross-sectional shape that is substantially the shape of a circle, an oval, a triangle, a square, a rectangle, or a polygon.

Example 35. The device of any one of Examples 1-34, wherein a concentration of holes penetrating the first thickness (of the dielectric layer) is between 1e4 holes/$cm^2$ and about 1e8 holes/$cm^2$ or about between about 1e4 holes/$cm^2$ and about 1e6 holes/$cm^2$.

Example 36. The device of any one of Examples 1-35, wherein the holes are positioned in a non-random pattern on a surface of the dielectric layer.

Example 37. The device of any one of Examples 1-36, wherein the holes are positioned in a random pattern on a surface of the dielectric layer.

Example 38. The device of any one of Examples 1-37, wherein each crack or fissure has a characteristic width between about one nanometer and about one micron, or between about 2 nm and about 200 nm.

Example 39. The device of any one of Examples 1-38, further comprising a metal layer, wherein the intervening layer is positioned between the metal layer and the substrate.

Example 40. The device of any one of Examples 1-39, wherein the metal layer is constructed of a metal comprising at least one of aluminum, silver, gold, titanium, molybdenum, copper, or nickel.

Example 41. The device of any one of Examples 1-40, wherein the passivating contact further comprises the metal layer.

Examples of Methods

Example 1. A method for making a passivating contact, the method comprising: a first treating of a first intermediate device comprising a substrate and a dielectric layer having a thickness, wherein the first treating results in the forming of a second intermediate device comprising at least one of a hole or a crack that passes through the thickness (of the dielectric layer) or a region of dielectric breakdown through the thickness (of the dielectric layer); depositing a temporary layer onto the second intermediate device to form a third intermediate device, such that the dielectric layer is positioned between the substrate and the temporary layer; and a second treating of the second intermediate device resulting in the forming of a device comprising the passivating contact, wherein: the second treating converts at least a portion of the temporary layer to an intervening layer where the dielectric layer is positioned between the substrate and the intervening layer, and the second treating drives at least a portion a material making up the intervening layer through the dielectric layer via at least one of the hole, or the crack, or the region of dielectric breakdown, thereby forming a conductive pathway through the dielectric layer.

Example 2. The method of Example 1, wherein the second treating comprises heating the second intermediate device at a temperature that is less than 1000° C.

Example 3. The method of either Example 1 or Example 2, wherein the heating is performed for a time period between about one second and about 10 hours.

Example 4. The method of any one of Examples 1-3, wherein: the first treating comprises the use of metal-assisted chemical etching (MACE) using nanoparticles, and the first treating results in the forming of a plurality of holes passing through the thickness (of the dielectric layer).

Example 5. The method of any one of Examples 1-4, wherein the MACE comprises utilizing a solution comprising HF and water.

Example 6. The method of any one of Examples 1-5, wherein the solution comprises an HF concentration between about 1 mol/L and about 4 mol/L.

Example 7. The method of any one of Examples 1-6, further comprising, prior to the first treating, applying the nanoparticles to a surface of the first intermediate device using a stamp.

Example 8. The method of any one of Examples 1-7, wherein the first treating results in a concentration of holes penetrating the thickness (of the dielectric layer) between 1e4 holes/$cm^2$ and about 1e8 holes/$cm^2$ or about between about 1e4 holes/$cm^2$ and about 1e6 holes/$cm^2$.

Example 9. The method of any one of Examples 1-8, wherein: the first treating comprises exposing the first intermediate device to an electric field, and the first treating results in the forming of a plurality of regions of dielectric breakdown passing through the thickness (of the dielectric layer).

Example 10. The method of any one of Examples 1-9, wherein the electric field is between about 1E6 V/m and about 1E13 V/m.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A double-side device comprising, in order:
a first silicon layer comprising n-doped polycrystalline silicon;
a first silicon oxide layer having a first thickness;
a second silicon layer comprising n-type crystalline silicon and having a first textured surface and a second textured surface;
a second silicon oxide layer having a second thickness; and
a third silicon layer comprising p-doped polycrystalline silicon, wherein:
a first plurality of conductive pathways comprising the n-doped polycrystalline silicon pass through the first thickness,
a second plurality of conductive pathways comprising the p-doped polycrystalline silicon pass through the second thickness,
the n-doped polycrystalline silicon penetrates into the second silicon layer forming a first plurality of penetrating regions within the second silicon layer, and
the p-doped polycrystalline silicon penetrates into the second silicon layer forming a second plurality of penetrating regions within the second silicon layer.

2. The double-side device of claim 1, wherein the second silicon layer is between about 0.1 µm and about 1000 µm.

3. The double-side device of claim 1, wherein at least a portion of the first plurality of penetrating regions penetrate between about 1 nm and about 1000 nm into the second silicon layer.

4. The double-side device of claim 1, wherein the first silicon oxide layer has a band gap greater than about 2 eV.

5. The double-side device of claim 4, wherein the band gap is between about 2 eV and about 20 eV.

6. The double-side device of claim 1, wherein the first silicon oxide layer is configured to passivate the second silicon layer.

7. The double-side device of claim 1, wherein the first thickness is between 1.9 nm and 50.0 nm.

8. The double-side device of claim 1, further comprising a layer comprising silicon nitride, wherein the first silicon layer is positioned between the first silicon oxide layer and the layer comprising silicon nitride.

* * * * *